United States Patent [19]
Sakamoto

[11] Patent Number: 6,087,870
[45] Date of Patent: Jul. 11, 2000

[54] OUTPUT CIRCUIT WHICH SWITCHES AN OUTPUT STATE IN ACCORDANCE WITH A TIMING SIGNAL AND A DELAY SIGNAL OF THE TIMING SIGNAL

[75] Inventor: Fumihiko Sakamoto, Tokyo, Japan

[73] Assignee: NEC Corporation, Tokyo, Japan

[21] Appl. No.: 09/078,758

[22] Filed: May 15, 1998

[30] Foreign Application Priority Data

May 16, 1997 [JP] Japan ................................. 9-143120

[51] Int. Cl.[7] .............................................. H03K 7/08
[52] U.S. Cl. .............................. 327/176; 327/404; 326/57
[58] Field of Search ................................. 327/173, 172, 327/176, 403, 404; 326/56, 57

[56] References Cited

U.S. PATENT DOCUMENTS

| | | | |
|---|---|---|---|
| 5,128,555 | 7/1992 | Millman | 307/443 |
| 5,617,049 | 4/1997 | Hirano et al. | 327/172 |
| 5,929,684 | 7/1999 | Daniel | 327/299 |

FOREIGN PATENT DOCUMENTS 61-180342  11/1986  Japan .

*Primary Examiner*—Jeffrey Zweizig
*Attorney, Agent, or Firm*—Sughrue, Mion, Zinn, Macpeak & Seas, PLLC

[57] ABSTRACT

An output circuit according to the present invention is provided with a delay circuit for delaying an enable control signal by a predetermined period td and an output means capable of controlling the output state in either an enable or a disable state, wherein the output state of the first output means so controlled as to be switched from the disable to the enable in accordance with the enable control signal and to be switched from the enable to the disable state gradually in accordance with the signal supplied from the first delay circuit.

11 Claims, 25 Drawing Sheets

PRIOR ART

OUTPUT CIRCUIT WHICH SWITCHES AN OUTPUT STATE IN ACCORDANCE WITH A TIMING SIGNAL AND A DELAY SIGNAL OF THE TIMING SIGNAL

BACKGROUND OF THE INVENTION

The present invention relates to an output circuit, and more particularly, to an output circuit for using in a circuit which is connected to a signal line, and which supplies signals to or receives signals from another circuit through the signal line.

A conventional output circuit of this type, for example, is used in a bus circuit. In the conventional bus circuit including the output circuits of this kind, a plurality of output circuits are connected to and asynchronously drive a common signal line. Each output circuit is controlled either in an enable state, in which a predetermined load driving current can be output, for communicating signals to another circuit through the common signal line, or in a disable state, in which no load driving current is output, for inhibiting communication of signals to another circuit through the common signal line. While only one output circuit is exclusively designated for occupying the common signal line, if the timing transferring from the enable state to the disable state is delayed in some output circuit, there will arise a bus fight that at least two output circuits are simultaneously in the enable state.

An example of output circuit to solve aforementioned problem is disclosed in the official gazette of Utility Model Laid-Open No. Sho 61-180342.

Referring to FIG. 33, the output circuit 1030 disclosed in the above gazette has a timing signal output circuit 1031, a delay circuit 1033 and a NAND gate 1036. The timing signal output circuit 1031 supplies a timing signal 1032 prescribing the bus enable timing. The delay circuit 1033 delays the timing signal 1032 outputted from the timing signal output circuit 1031 for a period td', and supplies a delay signal 1034 to the NAND gate 1036. The NAND gate 1036 inputs the timing signal 1032 supplied from the timing signal output circuit 1033 and the delay signal 1034 supplied from the delay circuit 1033, and supplies a bus occupation permit signal 1013 to a bus buffer 6. The bus occupation permit signal 1013 indicates the timing of switching the output of the bus buffer 6 from the disable to the enable state, or from the enable to the disable state.

As shown in FIG. 34, when the delay signal 1034 rises at the time delayed for the period td' from an enable timing T1' prescribed by a timing signal 1032, the output circuit 1030 asserts the bus occupation permit signal 1013. The period td' is the maximum value of the time from the timing which the bus occupation permit signal 1013 has transferred from the enable to the disable state to the timing which an output of the bus buffer 6 is transferred from the enable to the disable state. At the time T2', if the transfer from the enable to the disable state delays in the bus buffer 6, a bus fight does not occur. This is because the beginning of the next cycle is delayed for the period td'. In this conventional output circuit, the transfer of the bus buffer 6 from the enable to the disable state is intended to accomplish at a disable timing T2', which is prescribed by the timing signal 1032 supplied from the timing signal output circuit 1031.

The above-described conventional output circuit has the following problems.

First, there is a problem that an increase of signal propagation delay time causes a deterioration of an operation speed of the bus circuit. The reason is that, as shown in the timing chart of FIG. 34, the switching of the bus buffer 6 from the disable to the enable state is delayed by td' relative to the desired enable timing T1' prescribed by the timing signal 1032 supplied from the timing signal output circuit 1031.

Second, there is another problem that the transmission efficiency is deteriorated by increasing or the operation cycle time of the bus circuit. The reason is that, the delay by td' of the switching of the bus buffer 6 from the disable to the enable state also delays by td' the time by the transitional load driving circuit, generated on the common signal line of the bus circuit, to disappear. While this transitional load driving current is flowing, if the bus buffer 6 is switched from the enable to the disable state, so-called switching noise arises to distort signal waveforms on the common signal line of the bus circuit and possibly to invite data errors. Therefore, in the conventional output circuit, the switching of the bus buffer 6 from the enable to the disable state is delayed by td by delaying the disable timing T2' itself, prescribed by the timing signal 1032, and eventually the operating cycle time (T2'-T1') of the bus circuit is extended from the original cycle period by td.

SUMMARY OF THE INVENTION

The present invention, therefore, has been attempted in view of the above-stated problems of the prior art, and its object is to provide an output circuit which not only eliminates wasteful consumption of power and enhances reliability by securely preventing bus fights but also is improved in speed and transmission efficiency.

According to a first aspect of the invention, there is provided an output circuit comprising a first delay circuit for delaying an enable control signal by a first predetermined period, and first output means capable of controlling the output state in either an enable state or a disable state, wherein the output state of said first output means is so controlled as to be switched by the enable control signal from the disable to the enable state and by a delayed signal supplied from the first delay circuit from the enable to the disable state.

Another output circuit according to the invention is similar to the output circuit according to the first aspect invention except that it has means to gradually accomplish in a second predetermined period the control to switch the output state of said first output means from the enable to the disable state.

Still another output circuit according to the invention is similar to the output circuit according to the first aspect invention except that said first output means is provided with a group of successively connected delay circuits, into which the delayed signal supplied from said first delay circuit is entered, for supplying a plurality of delayed signals successively further delayed within the extent of the second predetermined period; and a group of second output means controlled so that the output state of each be switched by said enable control signal from the disable to the enable state and by each of the plurality of successively delayed signals from the enable to the disable state, wherein the output terminals of the group of second output means are commonly connected to constitute the output of said first output means so that, when the output state of said first output means is to be switched from the disable to the enable state, the output terminals of the group of second output means simultaneously take on the enable state to supply the same signals and, when it is to be switched from the enable to the disable state, the outputs of the group of second output means are switched with successive lags from the enable to the disable state, resulting in accomplishing the control to switch the output state of said first output means from the enable to the disable state in a phased manner within said second predetermined period.

Yet another output circuit according to the invention has a plurality of output circuits according to said first aspect of the invention, configured so that a common enable control signal be entered into them and their output terminals be commonly connected to supply the same signals, having first delay circuits such as included in the output circuit according to said first aspect of the invention, whose delay time lengths are longer than the first predetermined period and slightly differ from one another within the extent of the second predetermined period, the control to switch the output state from the enable to the disable state being accomplished in a phased manner within said second predetermined period after a delay by said first predetermined period.

BRIEF DESCRIPTION OF THE DRAWINGS

Other features and advantages of the present invention will be made more apparent by the detailed description hereunder when taken in conjunction with the accompanying drawings, wherein.

In the drawings, the same reference numerals represent the same structural elements.

DETAILED DESCRIPTION OF THE PREFERRED EMBODIMENTS

First, a first preferred embodiment of the present invention is described below in detail.

Figure 1:
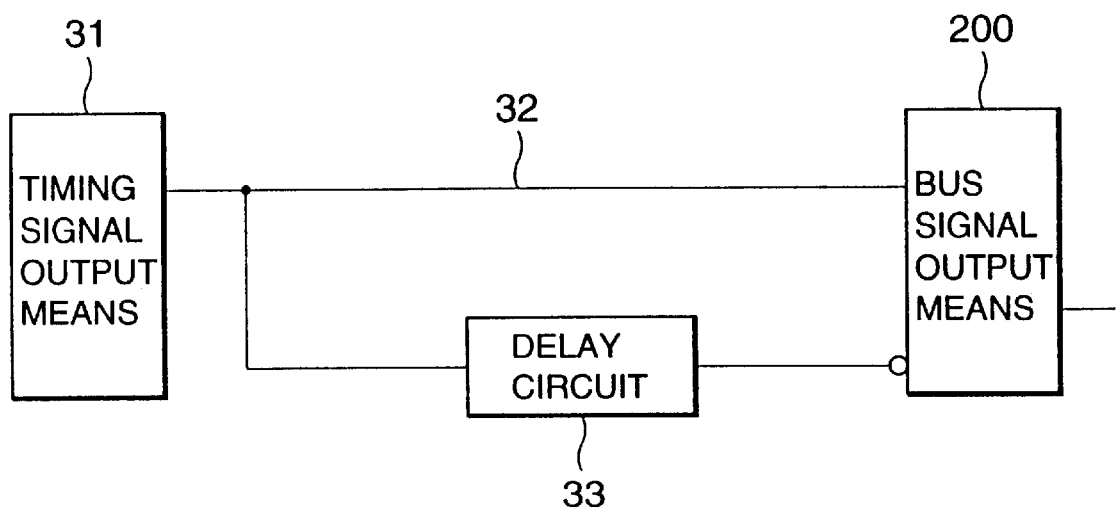
FIG. 1 is a block diagram illustrating a first preferred embodiment of the invention.

Referring to FIG. 1, an output circuit comprises an timing signal output means 31, an output circuit comprises a delay circuit 33 and output means 200. The timing signal output means 31 supplies an enable control signal 32 which designates transfer timing from an enable state to an disable state and from the disable state to the enable state. The delay circuit 33 inputs the enable control signal 32 output from the timing signal output means 31, generates an delay signal by delaying the enable control signal 32 for a first predetermined period (td in FIG. 2) and outputs the delay signal. The output means 200 inputs the enable control signal 32 from the timing signal output means 31 and the delay signal from the delay circuit 33. The output means 200 can control an output state in either the enable state or the disable state. In output circuit, the output state of the output means 200 is switched by the enable control signal 32 from the disable to the enable state and switched by the delay signal from the delay circuit 33 from the enable to the disable state.

Then, an operation of the first embodiment is described below.

Figure 2:
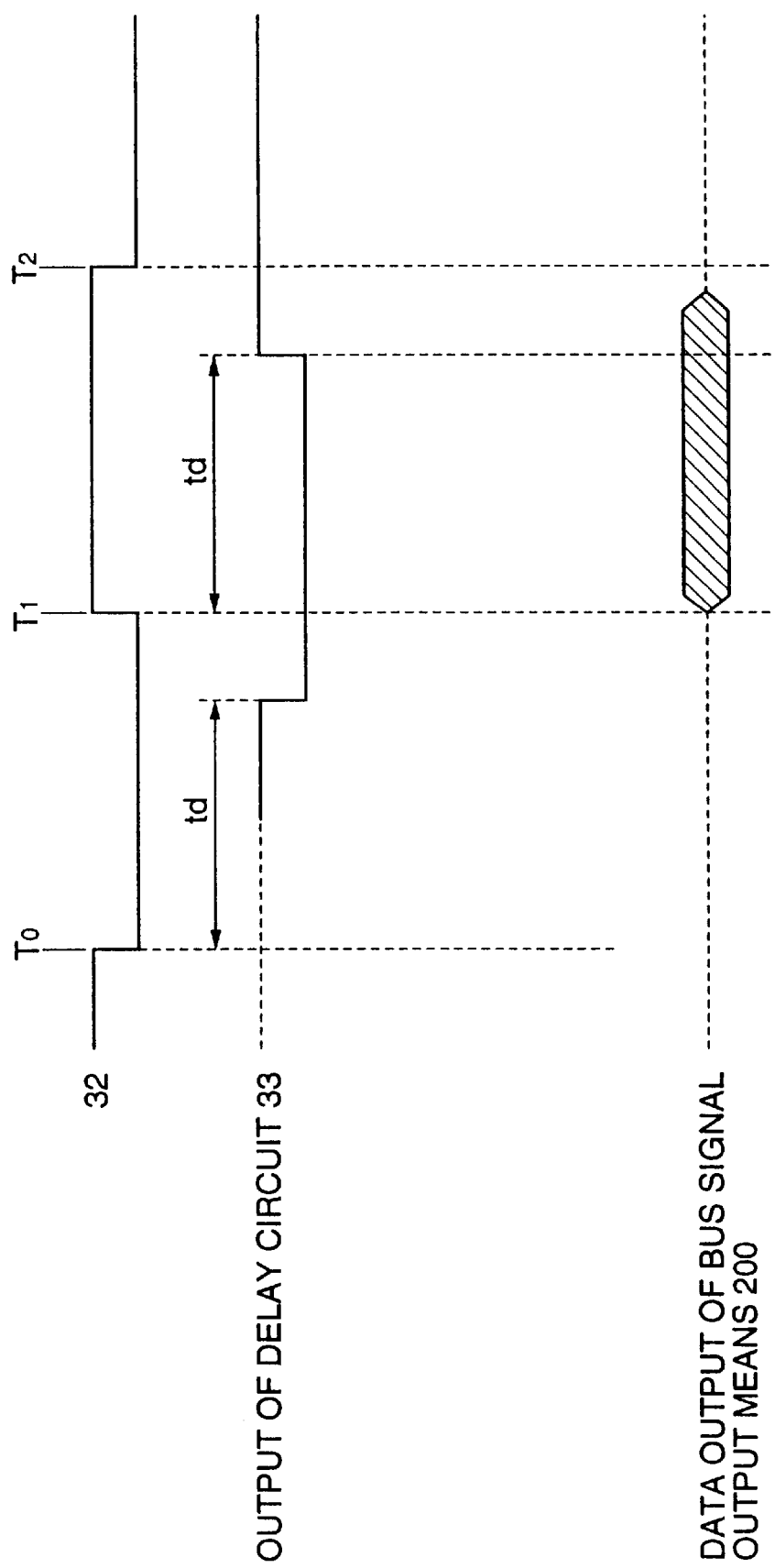
FIG. 2 is a timing chart of the first preferred embodiment of the invention.

Referring to FIG. 2, in the output circuit which is the first embodiment of the invention, the output signal of the delay circuit 33 is a delayed signal lagging behind the enable control signal, which is the input signal, by the first predetermined period td. Switching of the data output state of the output means 200 from the disable to the enable state is accomplished immediately (at a point of time T1) in accordance with the enable control signal 32. On the other hand, switching of the data output state of the output means 200 from the enable to the disable state is accomplished behind the point of time T1 by the first predetermined period td in accordance with the output signal of the delay circuit 33.

As described above, the output circuit which is the first embodiment of the invention allows the data output state of its output means 200 to be controlled in either the enable or the disable state, and can be used as output circuit for driving the common signal line of a bus circuit. When so used, as the enable timing T1 at which the data output state of the output means 200 is switched from the disable to the enable state is not delayed, the delay time of signal communication by the bus circuit is not increased. Furthermore, bus fights can be securely prevented by setting said first predetermined period td shorter than the length of time from the enable timing T1 of this output circuit till T2 when another output circuit takes on an enable state in the next cycle.

Next, a second preferred embodiment of the present invention is described below.

Figure 3:
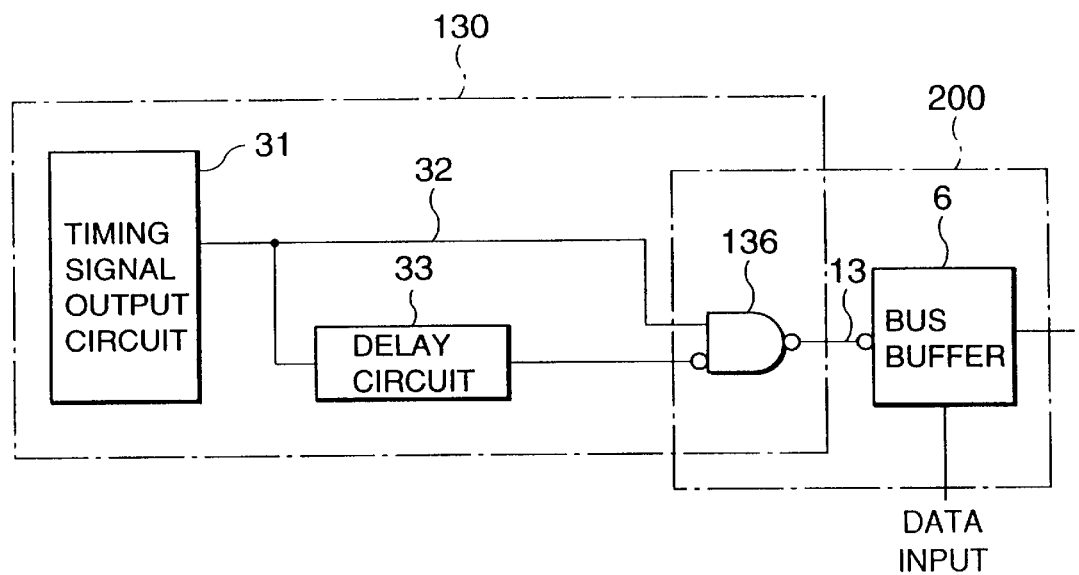
FIG. 3 is a block diagram illustrating a second preferred embodiment of the invention.

Referring to FIG. 3, an output circuit, which is the second embodiment of the invention, comprises a delay circuit 33 for delaying an enable control signal 32 by a first predetermined period (td in FIG. 4); a logic circuit 136, into which the enable control signal 32 and a delayed signal supplied from a delay circuit 33 are entered, for supplying an enable output control signal 13; and output buffers 6 capable of controlling the output state in either an enable state or a disable state with the enable output control signal 13. The logic circuit 136 generates the enable output control signal 13 to switch the output state of the output buffers 6 from the disable to the enable state in accordance with the enable control signal 32 and from the enable to the disable state in accordance with the delayed signal supplied from the delay circuit 33. A circuit block 200 consisting of the output buffers 6 and the logic circuit 136 shown in FIG. 3 corresponds to the output means 200 in FIG. 1.

Now the operation of this embodiment is described below.

Figure 4:
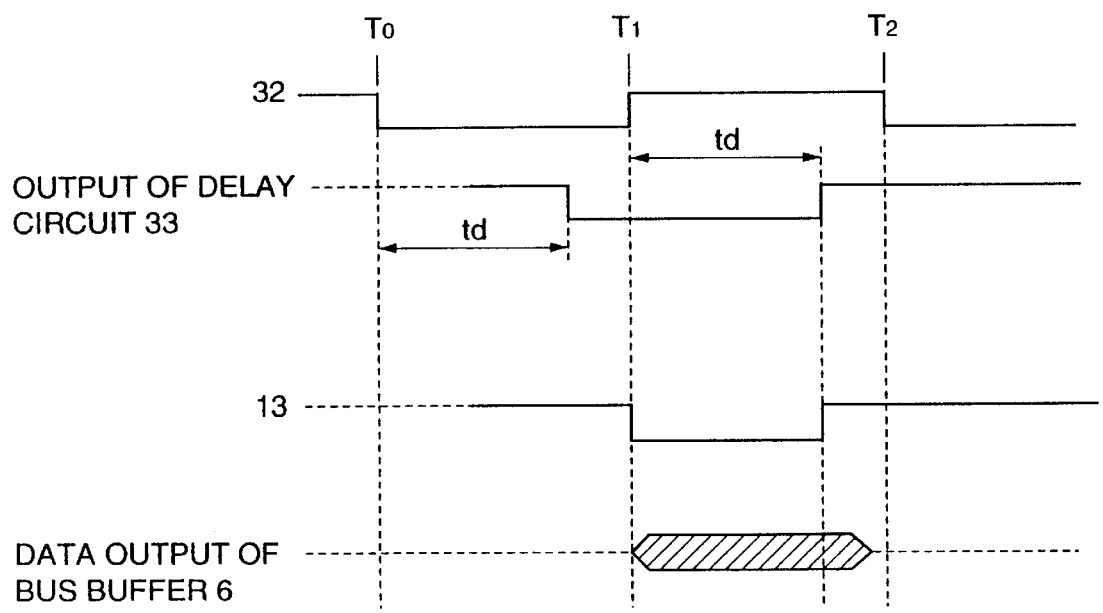
FIG. 4 is a timing chart of the second preferred embodiment of the invention.

Referring to FIG. 4, in the output circuit which is the second embodiment of the invention, the output signal of the delay circuit 33 is a delayed signal lagging behind the enable control signal, which is the input signal, by the first predetermined period td. The logic circuit 136, into which the enable control signal 32 and the output signal of the delay circuit 33 are entered, generates from the point of time T1 on the enable output control signal 13 of negative logic in a pulse width of td. Into the output buffers 6 is entered the enable output control signal 13, and the data output state of the output buffers 6 is in the enable state during the pulse width of td.

Thus, switching of the data output state of the output buffers 6 from the disable to the enable state is accomplished immediately (at the point of time T1) in accordance with the enable control signal 32 entered into the logic circuit 136. On the other hand, switching of the data output state of the output buffers 6 from the enable to the disable state is accomplished behind the point of time T1 by the first predetermined period td in accordance with the output signal of the delay circuit 33.

Here, the data output signal of the output buffers 6 acts in the same manner as the data output signal of the output means 200 in FIG. 1 described with reference to FIG. 2, and the part 200 consisting of the output buffers 6 and the logic circuit 136 of FIG. 3 operates in a way equivalent to the output means 200 in FIG. 1.

As described above, the output circuit which is the second embodiment of the invention allows the data output state of its output buffers 6 to be controlled in either the enable or the disable state, and can be used as output circuit for driving the common signal line of a bus circuit.

When so used, as the enable timing T1 at which the data output state of the output buffers 6 is switched from the disable to the enable state is not delayed, the delay time of signal communication by the bus circuit is not increased. Furthermore, bus fights can be securely prevented by setting said first predetermined period td shorter than the length of time from the enable timing T1 of the output circuit, i.e. this embodiment of the invention, till T2 when another output circuit takes on an enable state in the next cycle.

Next, a third preferred embodiment of the present invention is described below in detail.

Figure 5:
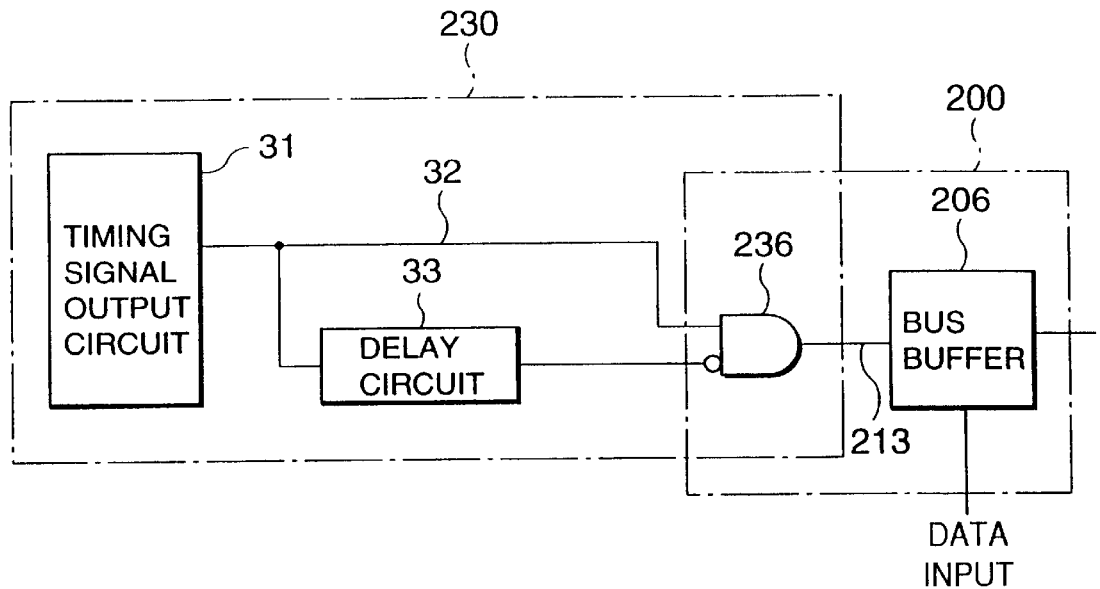
FIG. 5 is a block diagram illustrating a third preferred embodiment of the invention.

Referring to FIG. 5, an output circuit, which is the third embodiment of the invention, comprises a delay circuit 33 for delaying an enable control signal 32 by a first predetermined period (td in FIG. 6); a logic circuit 236, into which the enable control signal 32 and a delayed signal supplied from a delay circuit 33 are entered, for supplying an enable output control signal 213; and output means 206 capable of controlling the output state in either an enable state or a disable state with the enable output control signal 213. The logic circuit 236 generates the enable output control signal 213 to switch the output state of the output means 206 from the disable to the enable state in accordance with the enable control signal 32 and from the enable to the disable state in accordance with the delayed signal supplied from the delay circuit 33.

The difference between the embodiments illustrated in FIGS. 3 and 5 consists in that the configuration of FIG. 5 has a part 200 composed of the logical circuit 236 and the output means 206 in place of the logical circuit 136 and the output buffers 6 of FIG. 3 so that the enable output control signal 213 in the embodiment shown in FIG. 5 be reverse in polarity to the enable output control signal 13 in the embodiment shown in FIG. 3.

Figure 6:
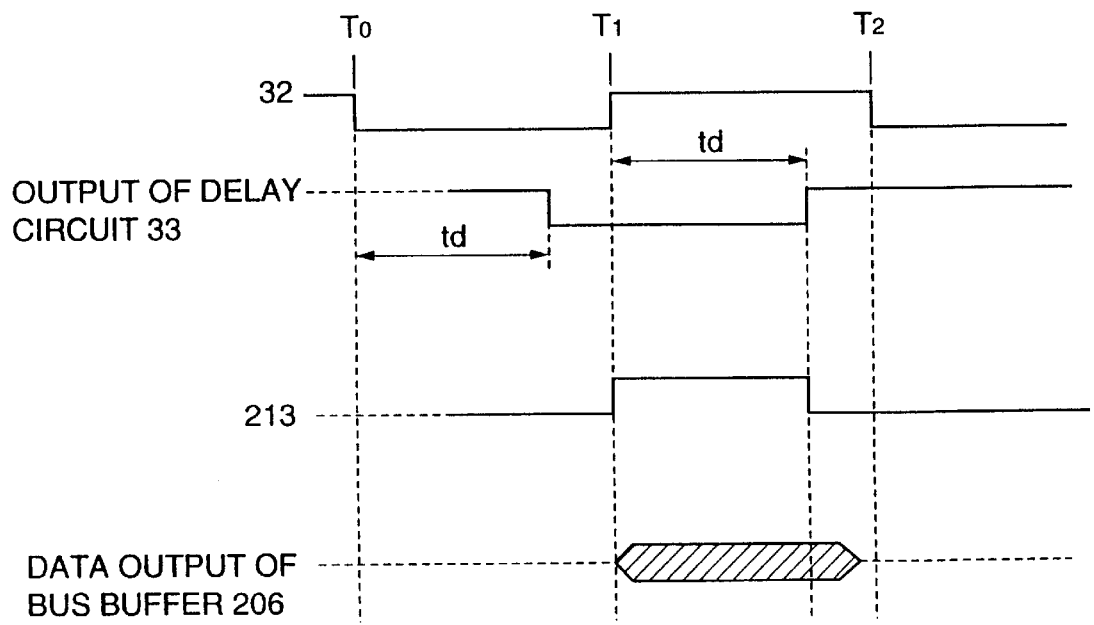
FIG. 6 is a timing chart of the third preferred embodiment of the invention.

To compare FIG. 6 with the timing chart of FIG. 4 showing the operation of the output which is the second embodiment of the invention, while the enable output control signal 213 of FIG. 6 acts in reverse polarity to the enable output control signal 13 of FIG. 4 relative to the same enable control signal 32, the data output of the output means 206 of FIG. 6 operates in the same way as the data output of the output buffers 6 of FIG. 4. Thus the part 200 consisting of the output means 206 and the logic circuit 236 shown in FIG. 5, like the part 200 consisting of the output buffers 6 and the logic circuit 136 shown in FIG. 3, corresponds to the output means 200 in FIG. 1.

Now is described below in detail a fourth preferred embodiment of the present invention.

Figure 7:
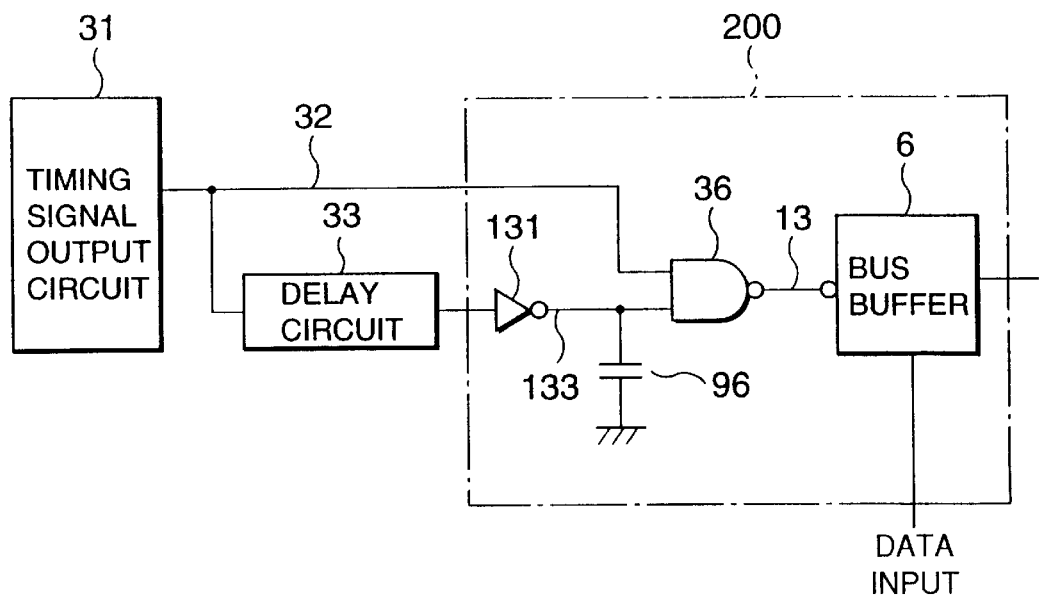
FIG. 7 is a block diagram illustrating a fourth preferred embodiment of the invention.

Referring to FIG. 7, an output circuit, which is the fourth embodiment of the invention, comprises a first delay circuit 33 for delaying an enable control signal 32 by a first predetermined period (td in FIG. 8); an inverter 131 for supplying an enable control signal 133, resulting from the inversion and delaying of a delayed signal supplied from the first delay circuit 33 and entered into it; a capacitor 96 connected to the output of the inverter 131 to ease the level variation of the enable control signal 133 in a second predetermined period (a differential length of time from td to td-n in FIG. 8); a logic circuit 36, into which the enable control signal 32 and the inverted and delayed enable control signal 133 is entered, for supplying an enable output control signal 13; and output buffers 6 capable of controlling the output state in either an enable state or a disable state with the enable output control signal 13.

The logic circuit 36 generates the enable output control signal 13 to switch the output state of the output buffers 6 from the disable to the enable state in accordance with the enable control signal 32 and gradually from the enable to the disable state in the second predetermined period (a differential length of time from td to td-n in FIG. 8) in accordance with the delayed signal supplied from the delay circuit 33. Here the circuit consisting of the output buffers 6, the logic circuit 36 and the inverter 131 shown in FIG. 7, correspond to the output means 200 shown in FIG. 3 and, augmented with the capacity 96, to the output means 200 in FIG. 1.

Figure 8:
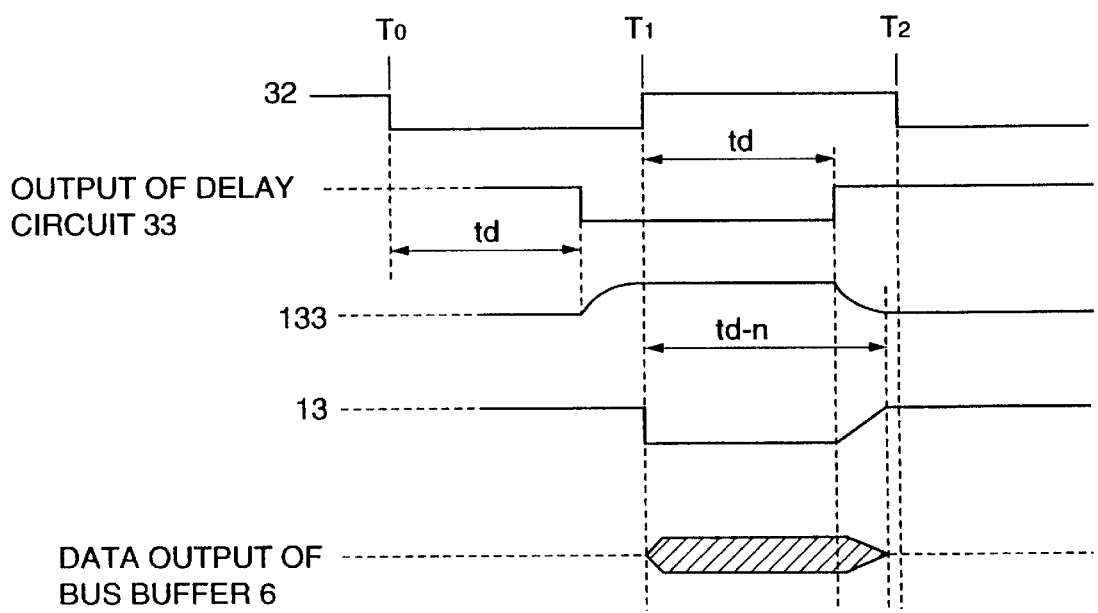
FIG. 8 is a timing chart of the fourth preferred embodiment of the invention.

The output circuit illustrated in FIG. 7, which is the fourth embodiment of the invention, is characterized by the capacitor 96, which constitute means to gradually accomplish the control to switch the output state of the output means 200 from the enable to the disable state in the second predetermined period (a differential length of time from td to td-n in FIG. 8).

Now is described the operation of this embodiment.

Referring to FIG. 8, in the output circuit which is the fourth embodiment of the invention, the output signal of the delay circuit 33 is behind the enable control signal 32, which is the input signal, by the first predetermined period td. The output signal of the delay circuit 33 is entered into the inverter 131, and supplied as inverted and delayed enable control signal 133. As the inverted and delayed enable control signal 133 is connected to the capacitor 96, the level change takes place gradually in the second predetermined period (a differential length of time from td to td-n).

The logic circuit 36, into which the enable control signal 32 and the inverted and delayed enable control signal are entered, generates the enable output control signal 13 of negative logic which immediately places the output state of the output buffers 6 in the enable state at the point of time T1 and, after the first predetermined period td, gradually varies it into the disable state in the second predetermined period (a differential length of time from td to td-n). As the enable output control signal 13 is entered into the output buffers 6, the data output state of the output buffers 6 immediately takes on the enable state at the point of time T1 and, after staying in the enable state during the first predetermined period td, changes gradually in to the disable state in the second predetermined period (a differential length of time from td to td-n).

Thus, the switching of the data output buffers 6 from the disable to the enable state immediately (at the point of time T1) takes place in accordance with the enable control signal 32. On the other hand, that of the data output buffers 6 from the enable to the disable state, after being delayed by the first predetermined period td behind the point of time T1 of the enable control signal 32, is gradually accomplished in the second predetermined period (a differential length of time from td to td-n).

Here, the circuit shown in FIG. 7 consisting of the output buffers 6, the logic circuit 36 and the inverter 131 performs actions corresponding to those of the output means 200 in FIG. 3, and the addition of the capacity 96 realizes means to gradually accomplish the control to switch the output state of the output means 200 from the enable to the disable state in the second predetermined period (a differential length of time from td to td-n).

As described above, the output circuit which is the fourth embodiment of the invention allows the data output state of its output buffers 6 to be controlled in either the enable or the disable state, and can be used as output circuit for driving the common signal line of a bus circuit. When so used, as the enable timing T1 at which the data output state of the output buffers 6 is switched from the disable to the enable state is not delayed, the delay time of signal communication by the bus circuit is not increased. Furthermore, bus fights can be securely prevented by setting the total (td-n) of said first predetermined period and second length of time shorter than the length of time from the enable timing T1 of this output circuit till T2 when another output circuit takes on an enable state in the next cycle.

In addition, particularly even if a transitional load driving current remains on the common signal line of the bus circuit in the second predetermined period (a differential length of time from td to td-n) after said first predetermined period, the generation of switching noise can be reduced because, as stated above, the switching of the first output buffers 6 from the enable to the disable state takes place gradually. This makes it possible to set the total (td-n) of said first predetermined period and second length of time substantially equal to the length of time taken by the transitional driving current arising on the common signal line of the bus circuit to disappear, and enhance the transmission efficiency by minimizing the operating cycle time (T2–T1) of the bus circuit.

Next is described a fifth embodiment of the present invention below in detail.

Figure 9:
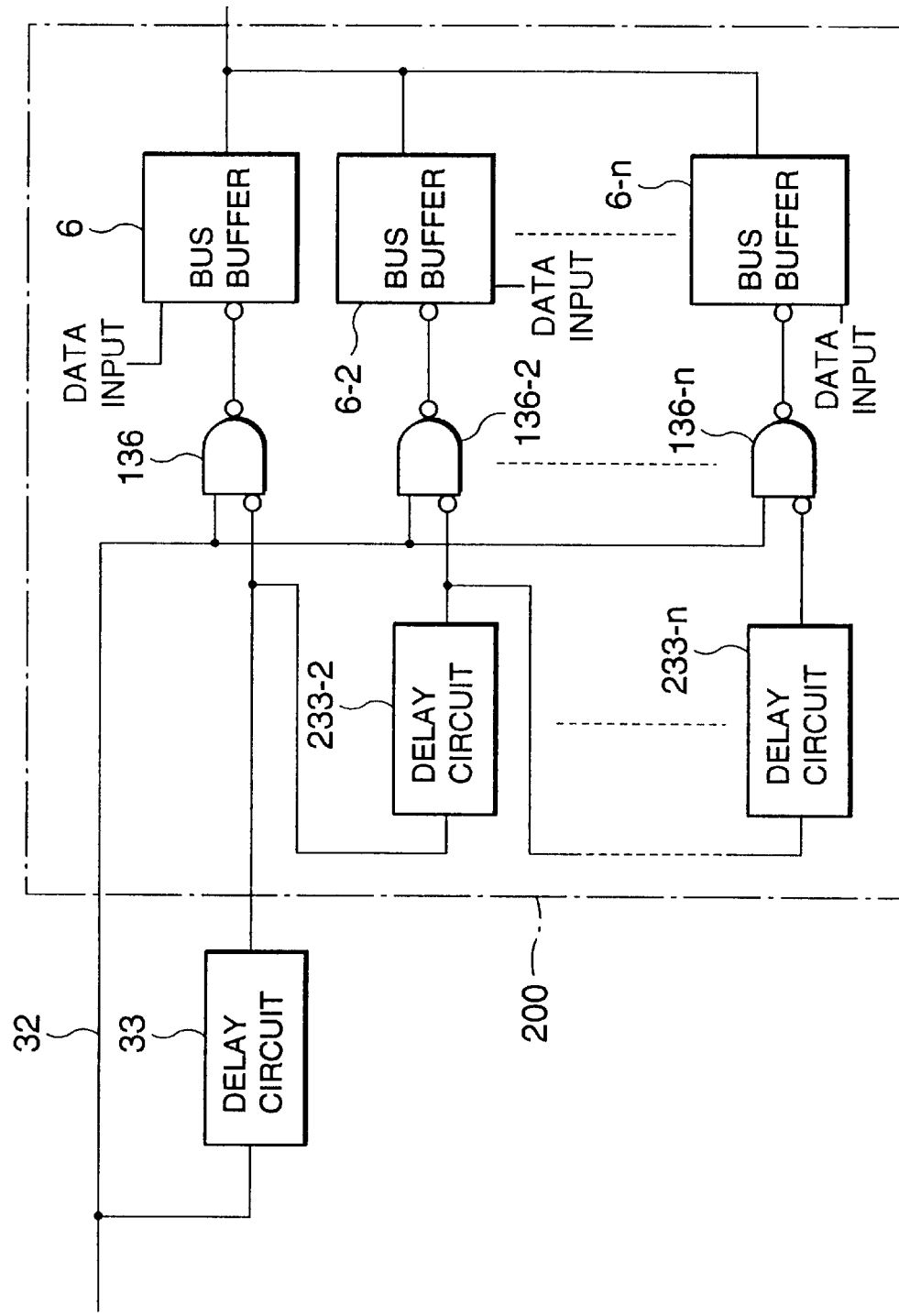
FIG. 9 is a block diagram illustrating a fifth preferred embodiment of the invention.

Referring to FIG. 9, an output circuit comprises a first delay circuit 33 delaying an enable control signal 32 for a first predetermined period (td in FIG. 10), and output means 200 receiving the enable control signal 32 and a delay signal supplied from the first delay circuit 33. The output means 200 can control the output state to the bus in either an enable state or a disable state. The output means 200 has a plurality of bus buffers 6 to 6-n, a plurality of logic circuits 136 to 136-n and a plurality of second delay circuits 233-2 to 233-n. The plurality of second delay circuits 233-2 to 233-n successively connected so that they output delay signals gradually delayed from the delay signal supplied by the first delay circuit 33. The plurality of delay signal delayed and outputted by the second delay circuits 233-2 to 233-n is successively delayed within the extent of a second predetermined period (a differential length of time from td to td-n in FIG. 10). The plurality of logic circuits 136 to 136-n supplies the corresponding one of the output buffers 6 to 6-n with signals for switching between the enable and disable output states. The output buffers 6 to 6-n control output states of output means 200 either in the enable or the disable state. Each output terminals of the output buffers 6 to 6-n are commonly coupled and connected to the bus line.

Each of the logic circuits 136 to 136-n inputs the enable control signal 32 in common, and inputs each of a plurality of delay signals which is gradually delayed by and supplied from the first delay circuit 33 and the plurality of second delay circuits 233-2 to 233-n. More particularly, the logic circuit 136 inputs the enable control signal 32 and a delay signal from the delay circuit 33. The logic circuit 136-2 inputs the enable control signal 32 and a delay signal from the delay circuit 233-2. The logic circuit 136-n inputs the enable control signal 32 and a delay signal from the delay circuit 233-n. Each logic circuits 136 to 136-n simultaneously outputs a signal which indicates transfer from the disable to the enable state to corresponding one of the bus buffer 6 to 6-n in accordance with the enable control signal 32. The logic circuits 136 to 136-n gradually output signals which indicate transfer from the enable to the disable state in succession in accordance with the plurality of delay signals successively supplied at a different timing from the first delay circuit 33 and the plurality of second delay circuits 233-2 to 233-n with successive lags.

Here, the part 200 shown in FIG. 9, consisting of the group of output buffers 6 to 6-n, the group of logic circuits 136 to 136-n, and the group of second delay circuits 233-2 to 233-n, corresponds to the output means 200 in FIG. 1.

Figure 10:
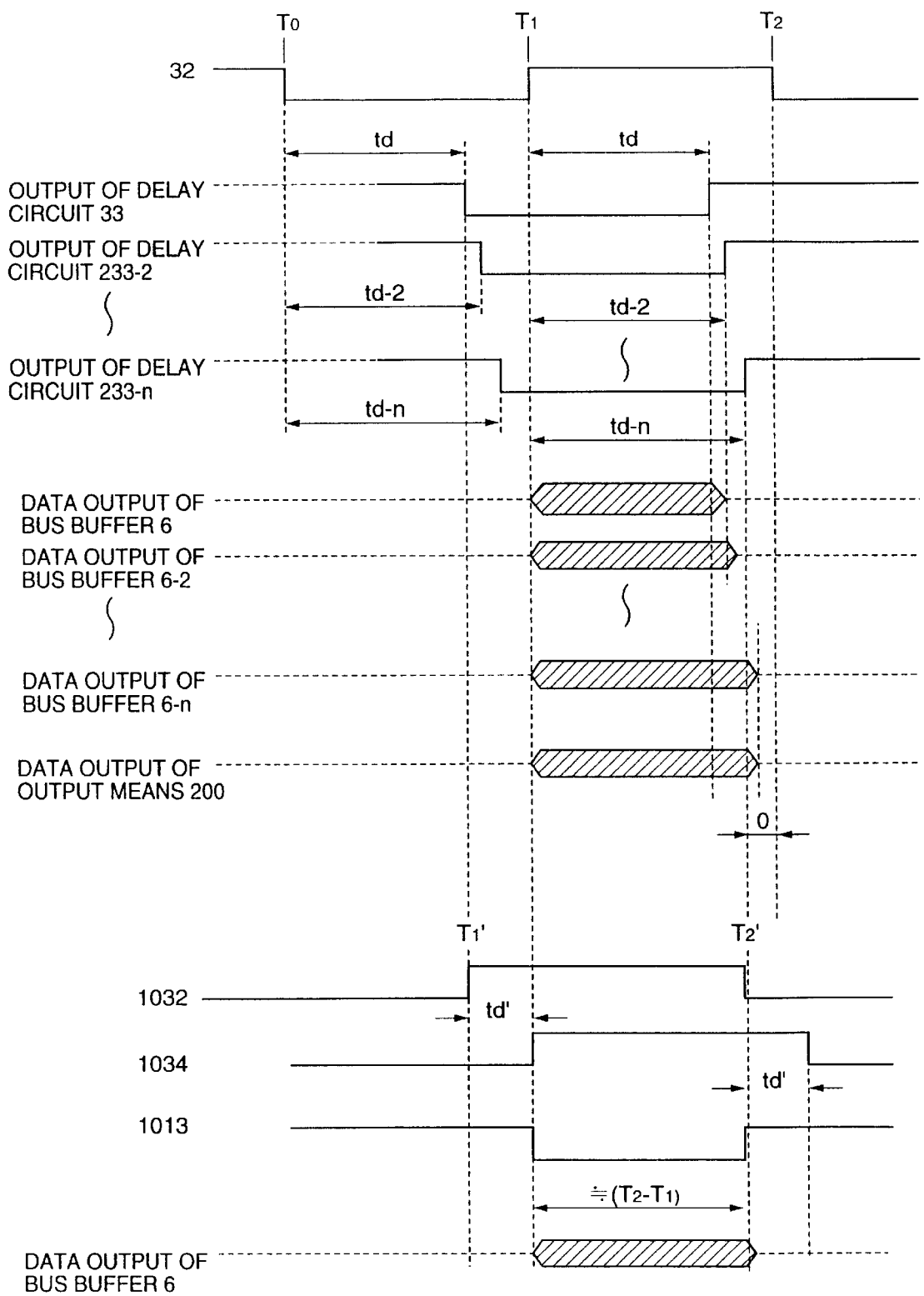
FIG. 10 is a timing chart of the fifth preferred embodiment of the invention.

The output circuit, in the fifth embodiment of the invention, is characteristic in that in particular the control to switch the output state of the output means 200 from the enable to the disable state in a phased manner in the second predetermined period (a differential length of time from td to td-n in FIG. 10).

Then, an operation of this fifth embodiment is describe below.

Referring to FIG. 10, in the output circuit which is the fifth embodiment of the invention, the output signal of the delay circuit 33 is behind the enable control signal 32, which is the input signal, by the first predetermined period td. Then, the plurality of delayed signals successively supplied from the group of successively connected delay circuits 233-2 to 233-n become further delayed behind the enable control signal 32 by the second predetermined period (a differential length of time from td to td-n) after the first predetermined period td. The switching of the data output state of the output buffers 6 from the disable to the enable state is accomplished immediately (at the point of time T1) in accordance with the enable control signal 32.

On the other hand, the switching of the data output state of the output buffers 6 from the enable to the disable state takes place, in accordance with the output signal of the delay circuit 33 entered into the logic circuit 136, behind the point of time T1 of the enable control signal 32 by the first predetermined period td.

Similarly, the switching of the data output state of each of the individual output buffers 6-2 to 6-n from the disable to the enable state takes place immediately (at the point of time T1) in accordance with the enable control signal 32 entered into each of the logic circuits 136-2 to 136-n, and the switching of the data output state of each of the individual output buffers 6 to 6-n from the enable to the disable state is accomplished in accordance with the respective output signals of the delay circuits 233-2 to 233-n entered into the logic circuits 136-2 to 136-n respectively, further behind successively within the extent (td-2, . . . , td-n) of the second predetermined period (a differential length of time from td to td-n) after the point of time T1 of the enable control signal 32 by the first predetermined period td.

To sum up the foregoing, the switching of the respective data output states of all the output buffers 6 to 6-n from the disable to the enable state simultaneously takes place immediately (at the point of time T1) in accordance with the enable control signal 32, and the switching of the respective data output states of the output buffers 6 to 6-n from the enable to the disable state takes place with further successive lags within the extent of the second predetermined period (a differential length of time from td to td-n) after the point of time T1 of the enable control signal 32 by the first predetermined period td.

Here, the data output signal of the part 200 shown in FIG. 9, consisting of the group of output buffers 6 to 6-n, the group of logic circuits 136 to 136-n, and the group of second delay circuits 233-2 to 233-n, corresponds to that of the output means 200 in FIG. 1 described with reference to the timing chart of FIG. 2.

Next will be described the benefits of the output circuit, i.e. this embodiment of the invention, as compared with a similar output circuit according to the prior art.

In the prior art output circuit, so that the bus occupation permit signal 1013 be substantially equal to the cycle period (T1–T2), the cycle period is extended by td' to (T1'–T2'). The cycle is started at a point of time T1', earlier than the point of time T1 by the period td'. The end time of the cycle is a point of time T2', substantially equal to the point of time T2.

By contrast, the switching of the data output state of the output means 200 from the disable to the enable state is accomplished immediately (at the point of time T1) in accordance with the enable control signal 32 as the individual data output signals of the group of output buffers 6 to 6-n are commonly connected and act collectively as data output signal of the output means 200. The switching of the data output state of the output means 200 takes place in a phased manner in the second predetermined period (a differential length of time from td to td-n) after the point of time T1 of the enable control signal 32 by the first predetermined period td. If the period td-n is made infinitely close to the cycle period (T1–T2), it is possible to fully complete the data output from the output means 200 by the point of time T2 and to start the next cycle at the point of time T2.

As described above, the output circuit which is the fifth embodiment of the invention, allows the data output state of its output means 200 to be controlled in either the enable or the disable state, and can be used as output circuit for driving the common signal line of a bus circuit. When so used, as the enable timing T1 at which the data output state of the output means 200 is switched from the disable to the enable state is not delayed, the delay time of signal communication by the bus circuit is not increased. Furthermore, bus fights can be securely prevented by setting the total (td-n) of said first predetermined period and second length of time shorter than the length of time from the enable timing T1 of this output circuit till T2 when another output circuit takes on an enable state in the next cycle. In addition, particularly even if a transitional load driving current remains on the common signal line of the bus circuit in the second predetermined period (a differential length of time from td to td-n) after said first predetermined period, the generation of switching noise can be reduced because, as stated above, the switching of the first output buffers 6 from the enable to the disable state takes place in a phased manner. This makes it possible to set the total (td-n) of said first predetermined period and second length of time substantially equal to the length of time taken by the transitional driving current arising on the common signal line of the bus circuit to disappear, and enhance the transmission efficiency by minimizing the operating cycle time (T2–T1) of the bus circuit.

Next, a sixth preferred embodiment of the present invention is described in detail below.

Figure 11:
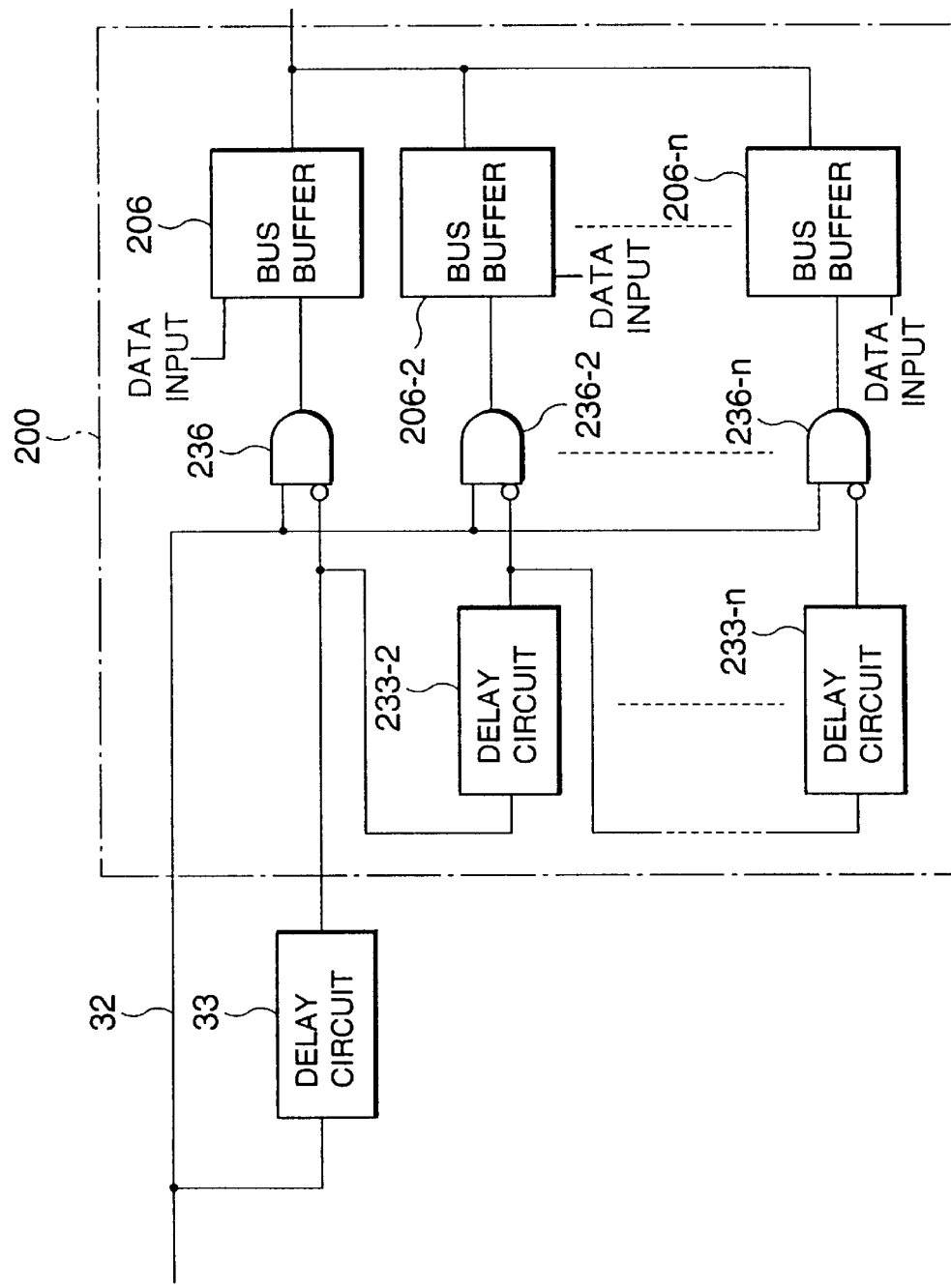
FIG. 11 is a block diagram illustrating a sixth preferred embodiment of the invention.

Referring to FIG. 11, an output circuit, which is the sixth embodiment of the invention, comprises a first delay circuit 33 for delaying an enable control signal 32 by a first predetermined period (td in FIG. 12); and output means 200, into which the enable control signal 32 and a delayed signal supplied from the first delay circuit 33 are entered, capable of controlling the output state in either an enable state or a disable state. The output means 200 has a group of output means 206 to 206-n so configured that the output state of each individual output means can be controlled either in the enable or the disable state and the output terminals of the constituent output means can be connected in common to supply the same signals; a group of logic circuits 236 to 236-n for supplying the respective output means 206 to 206-n with control signals for switching between the enable and disable output states; and a group of second delay circuits 233-2 to 233-n successively connected so that the delayed signals, entered from the first delay circuit 33, be supplied as a plurality of signals successively delayed within the extent of a second predetermined period (a differential length of time from td to td-n in FIG. 12). Into the logic circuits 236 to 236-n is commonly entered the enable control signal 32, and a plurality of delayed signals supplied from the first delay circuit 33 and the group of second delay circuits 233-2 to 233-n with successive lags are individually entered. The logic circuits 236 to 236-n are so configured as to switch the respective output states of all the output means 206 to 206-n simultaneously from the disable to the enable state in accordance with the enable control signal 32, and individually from the enable to the disable state in succession in accordance with the plurality of delayed signals supplied from the first delay circuit 33 and the group of second delay circuits 233-2 to 233-n with successive lags.

The difference between the embodiments illustrated in FIGS. 9 and 11 is that, like the above-described difference between the embodiments of FIGS. 3 and 5, consists in that the configuration of FIG. 11 has a part 200 composed of the logical circuits 236-2 to 236-n and the output means 206 to 206-n, connected to each other by enable output control signals of reverse polarities in place of the logical circuits 136 to 136-n and the output buffers 6 to 6-n of FIG. 9.

Figure 12:
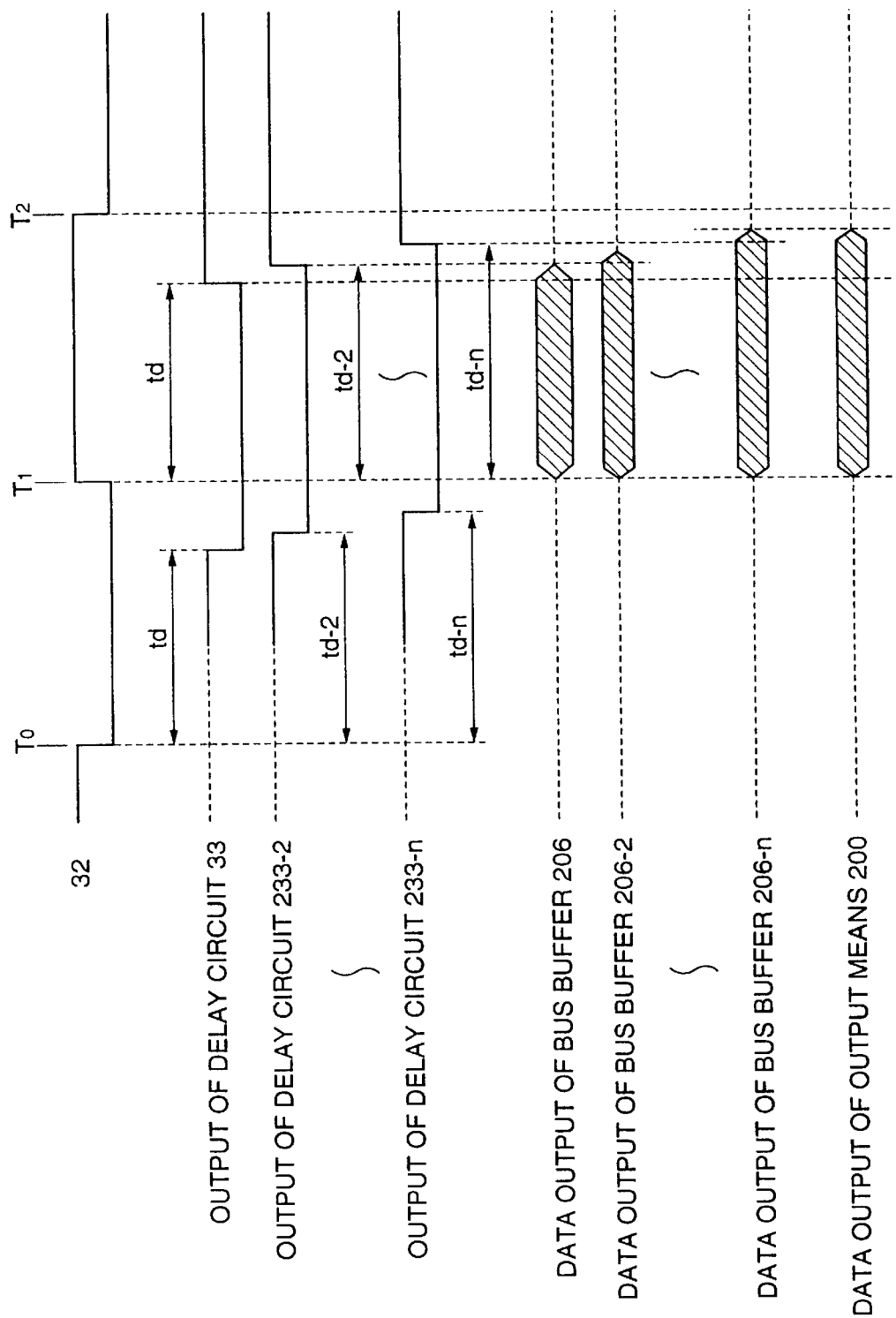
FIG. 12 is a timing chart of the sixth preferred embodiment of the invention.

To compare FIG. 12 with the timing chart of FIG. 10, relative to the same enable control signal 32, data outputs of the group of output means 206 to 206-n of FIG. 12 act in the same way as the data outputs of the output buffers 6 to 6-n of FIG. 10, and as a result the data outputs of the respective parts 200 act in the same way. Thus the part 200 consisting of the group of output means 206 to 206-n, the group of logic circuits 236 to 236-n and the group of delay circuits 233-2 to 233-n shown in FIG. 11, like the part 200 consisting of the group of output buffers 6 to 6-n, the group of logic circuit 136 to 136-n and the group of delay circuits 233-2 to 233-n shown in FIG. 9, corresponds to the output means 200 in FIG. 1.

Next is described in detail a seventh preferred embodiment of the present invention.

Figure 13:
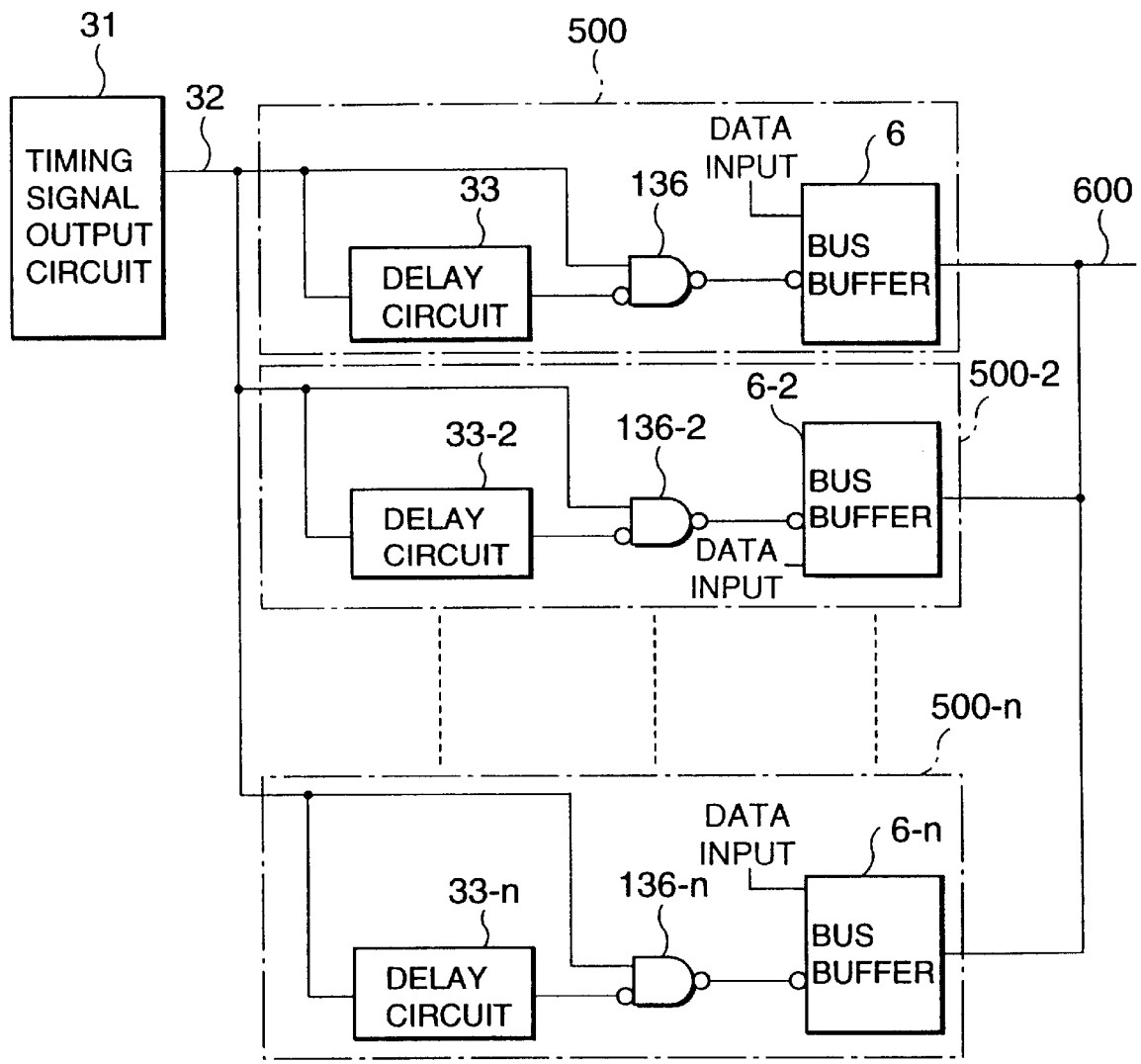
FIG. 13 is a block diagram illustrating a seventh preferred embodiment of the invention.

Referring to FIG. 13, an output circuit, which is the seventh embodiment of the invention, comprises a circuit part 500 consisting of output buffers 6 capable of controlling the output state in either an enable state or a disable state; a delay circuit 33 for delaying an enable control signal 32 by a first predetermined period (td in FIG. 14); and a logic circuit 136, into which the enable control signal 32 and a delayed signal supplied from the delay circuit 33 are entered, for performing control to switch the output state of the output buffers 6 from the disable to the enable state in accordance with the enable control signal 32 and from the enable to the disable state in accordance with the delay signal supplied from the delay circuit 33; and circuit parts 500-2 to 500-n respectively consisting, like the circuit part 500, of output buffers 6-2 to 6-n capable of controlling the output state in either the enable state or the disable state; delay circuits 33-2 to 33-n for delaying the enable control signal 32 with slightly different lags (td-2 to td-n in FIG. 14) not shorter than the first predetermined period (td in FIG. 14) and within the extent of the second predetermined period (a differential length of time from td to td-n in FIG. 14); and logic circuits 136-2 to 136-n, into which the enable control signal 32 and the delayed signals supplied from the delay circuits 33-2 to 33-n are entered, for performing control to switch the output state of the output buffers 6-2 to 6-n from the disable to the enable state in accordance with the enable control signal 32 and from the enable to the disable state in accordance with the delay signals supplied from the delay circuit 33-2 to 330n, wherein the output terminals of said plurality of parts 500 and 500-2 to 500n are commonly connected to supply the same signal 600.

Here, the part 500 shown in FIG. 13, consisting of the output buffers 6, the logic circuit 136, and the delay circuits 33, corresponds to the output circuit shown in FIG. 3, which is the second preferred embodiment of the present invention. Similarly, each of the parts 500-2 to 500-n of FIG. 13, consisting of the output buffers 6-2 to 6-n, the logic circuits 136-2 to 136-n, and the delay circuits 33-2 to 33-n, corresponds to the output means circuit shown in FIG. 3, which is the second embodiment of the invention.

Now is described the operation of this embodiment.

Figure 14:
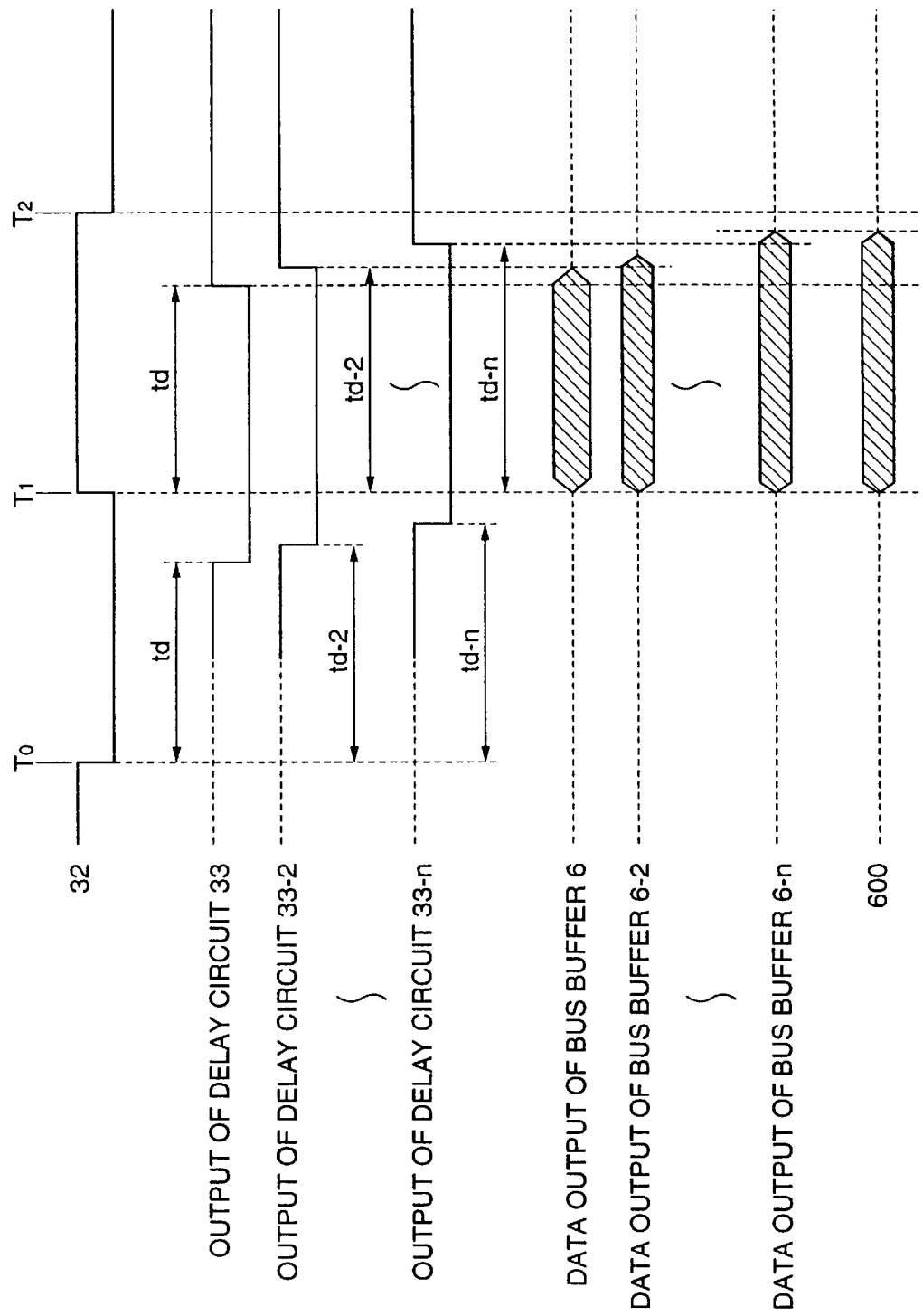
FIG. 14 is a timing chart of the seventh preferred embodiment of the invention.

Referring to FIG. 14, the output signal of the delay circuit 33 is behind the enable control signal 32, which is the input signal, by the first predetermined period td. Similarly, the output signals of the delay circuits 33-2 to 33-n are behind the enable control signal 32, which is the input signal, with slightly different lags (td-2 to td-n in FIG. 14) not shorter than the first predetermined period (td in FIG. 14) and within the extent of the second predetermined period (a differential length of time from td to td-n in FIG. 14).

The logic circuit 136, into which the enable control signal 32 and the output signal of the delay circuit 33 are entered, generates from the point of time T1 on the enable output control signal 13 of negative logic in a pulse width of td. Into the output buffers 6 is entered the enable output control signal 13, and the data output state of the output buffers 6 is becomes the enable state during the pulse width of td.

The switching of the data output state of the output buffers 6 from the disable to the enable state is accomplished immediately (at the point of time T1) in accordance with the enable control signal 32 entered into the logic circuit 136.

On the other hand, the switching of the data output state of the output buffers 6 from the enable to the disable state is accomplished behind the point of time T1 by the first predetermined period td in accordance with the output signal of the delay circuit 33. Similarly, the switching of the data output state of the output buffers 6-2 to 6-n from the disable to the enable state takes place immediately (at the point of time T1) in accordance with the enable control signal 32 entered into the logic circuits 136-2 to 136-n, respectively.

Meanwhile, the switching of the data output state of the output buffers 6 to 6-n from the enable to the disable state is accomplished in accordance with the respective output signals of the delay circuits 33-2 to 33-n behind the point of time T1 with slightly different lags (td-2 to td-n) not shorter than the first predetermined period td and within the extent of the second predetermined period (a differential length of time from td to td-n).

To sum up the foregoing, the switching of the respective data output states of all the output buffers 6 to 6-n from the disable to the enable state simultaneously takes place immediately (at the point of time T1) in accordance with the enable control signal 32, while the switching of the respective data output states of the output buffers 6 to 6-n from the enable to the disable state takes place with slightly different lags (td-2 to td-n) not shorter than the first predetermined period td and within the extent of the second predetermined period (a differential length of time from td to td-n).

Here, in the output circuit shown in FIG. 13, which is the seventh embodiment of the invention, as the data output signals of the output buffers 6 to 6-n are commonly connected and collectively supplied as the same signal 600, the switching of the output signal 600 from the disable to the enable state, as shown in FIG. 14, takes place immediately (at the point of time T1) in accordance with the enable control signal 32.

On the other hand, the switching of the output signal 600 from the enable to the disable state is accomplished in a phased manner in the second predetermined period (a differential length of time from td to td-n) after a lag by the first predetermined period td behind the point of time T1 of the enable control signal 32.

As described above, the output circuit which is the seventh embodiment of the invention, allows the output signal 600 to be controlled in either the enable or the disable state, and can be used as output circuit for driving the common signal line of a bus circuit. When so used, as the enable timing T1 at which the data output state of the output means 200 is switched from the disable to the enable state is not delayed, the delay time of signal communication by the bus circuit is not increased. Furthermore, bus fights can be securely prevented by setting the total (td-n) of said first predetermined period and second length of time shorter than the length of time from the enable timing T1 of this output circuit till T2 when another output circuit takes on an enable state in the next cycle.

In addition, particularly even if a transitional load driving current remains on the common signal line of the bus circuit in the second predetermined period (a differential length of time from td to td-n) after said first predetermined period, the generation of switching noise can be reduced because, as stated above, the switching of the output signal 600 from the enable to the disable state takes place in a phased manner.

This makes it possible to set the total (td-n) of said first predetermined period and second length of time substantially equal to the length of time taken by the transitional driving current arising on the common signal line of the bus circuit to disappear, and enhance the transmission efficiency by minimizing the operating cycle time (T2–T1) of the bus circuit.

Next is described in detail an eighth preferred embodiment of the present invention.

Figure 15:
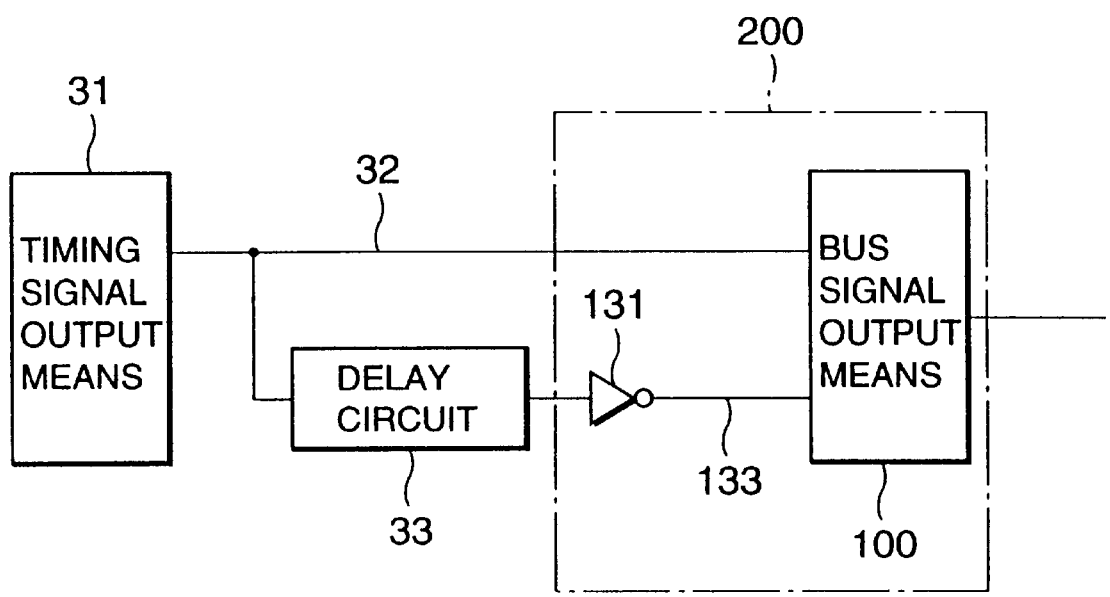
FIG. 15 is a block diagram illustrating a eighth preferred embodiment of the invention.

Referring to FIG. 15, an output circuit, which is the eighth embodiment of the invention, comprises a delay circuit 33 for delaying an enable control signal 32 by a first predetermined period (td in FIG. 2); an inverter 131 for inverting a delayed signal supplied from the delay circuit 33; and output buffers 6 capable of controlling the output state in either an enable state or a disable state with the enable control signal 32. It is so configured that the output state of the output means 100 is switched by the enable control signal 32 from the disable to the enable state and by an enable control signal 133, resulting from the inversion by the inverter 131 of the delayed signal supplied from the delay circuit 33, from the enable to the disable state. Here the part 200 shown in FIG. 15 consisting of the output means 100 and the inverter 131 corresponds to the output means 200 in FIG. 1.

Now is described in detail a ninth preferred embodiment of the present invention.

Figure 16:
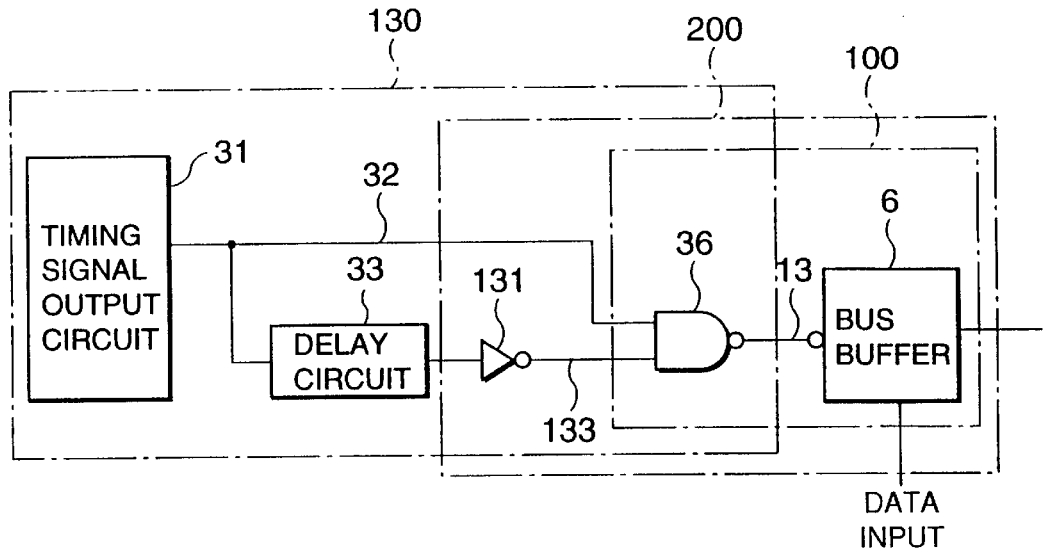
FIG. 16 is a timing chart of the eighth preferred embodiment of the invention.

Referring to FIG. 16, an output circuit, which is the ninth embodiment of the invention, comprises a delay circuit 33 for delaying an enable control signal 32 by a first predetermined period (td in FIG. 17); an inverter 131 for inverting a delayed signal supplied from the first delay circuit 33; a logic circuit 36, into which the enable control signal 32 and an enable control signal 133 inverted and supplied from the inverter 131 are entered, for supplying an enable output control signal 13; and output buffers 6 capable of controlling the output state in either an enable state or a disable state with the enable output control signal 13. The logic circuit 36 generates the enable output control signal 13 to switch the output state of the output buffers 6 from the disable to the enable state in accordance with the enable control signal 32 and from the enable to the disable state in accordance with the enable control signal 133, resulting from the inversion by the inverter 131 of the delayed signal supplied from the delay circuit 33.

Figure 17:
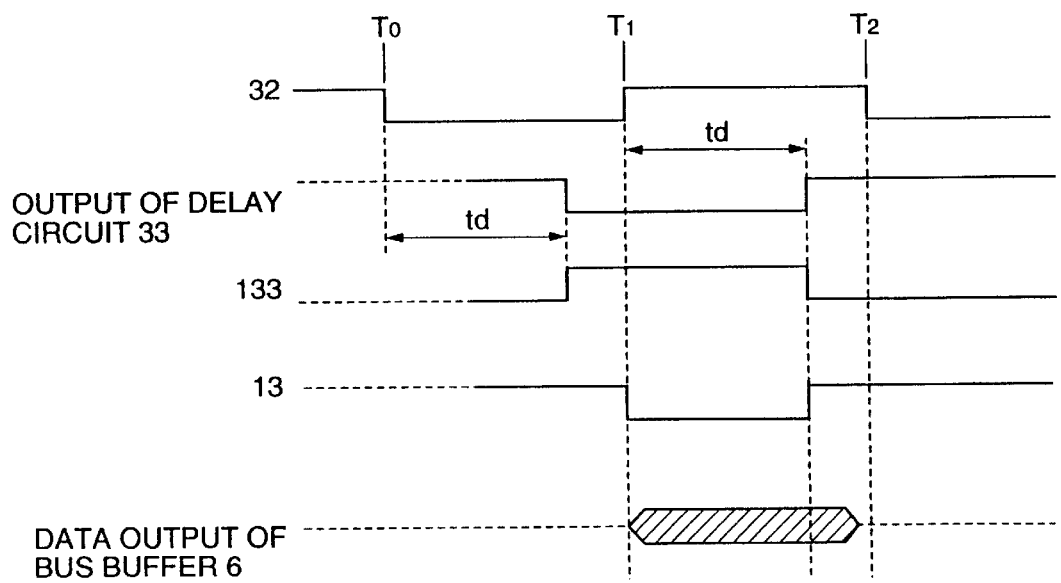
FIG. 17 is a block diagram illustrating a ninth preferred embodiment of the invention.

Here the part consisting of the inverter 131 and the logic circuit 36 shown in FIG. 16, correspond to the logic circuit 136 in FIG. 3. Therefore, to compare the timing chart of FIG. 17, illustrating the operation of the embodiment shown in FIG. 16, with the timing chart of FIG. 4, illustrating that of the embodiment shown in FIG. 3, in the operation illustrated in FIG. 17 the same enable output control signal 13 as in FIG. 4 is generated using the enable control signal 133 generated by inversion by the inverter 131 in response to the same enable control signal 32, and the data output of the output buffers 6 acts in the same way as its counterpart in FIG. 14. Thus this second embodiment of the first output circuit according to the invention, shown in FIG. 16, provides the same operational effect as the earlier cited embodiment of the first aspect of the invention, illustrated in FIG. 3.

The part 100 consisting of the output buffers 6 and the logic circuit 36, shown in FIG. 16, corresponds to the output means 100 in FIG. 15, and the part 200 consisting of the part 100 and the inverter 131, shown in FIG. 16, corresponds to the output means 200 in FIG. 1.

Next is described in detail a 10th preferred embodiment of the present invention.

Figure 18:
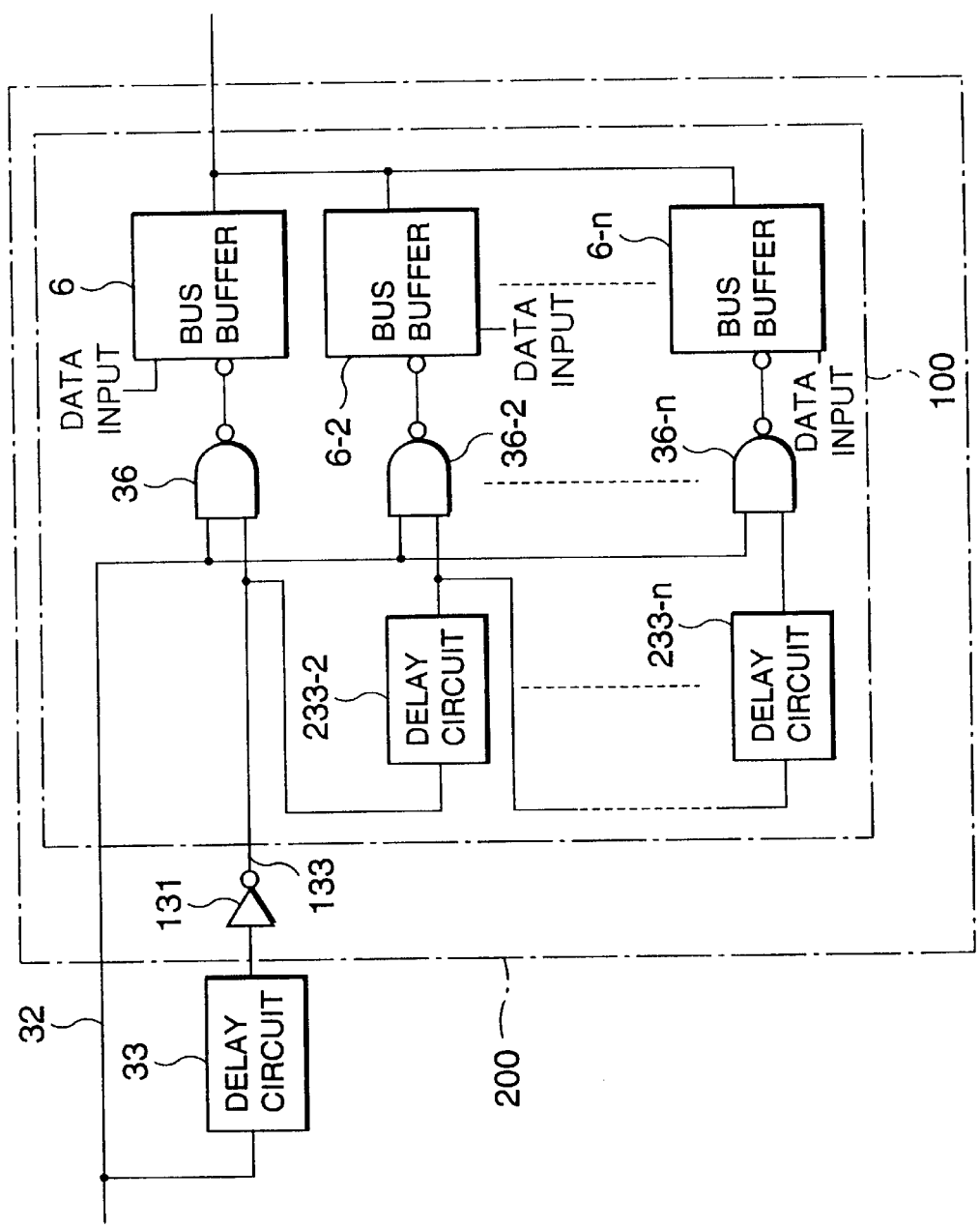
FIG. 18 is a timing chart of the ninth preferred embodiment of the invention.

Referring to FIG. 18, an output circuit, which is the 10th embodiment of the invention, comprises a first delay circuit 33 for delaying an enable control signal 32 by a first predetermined period (td in FIG. 19); an inverter 131, into which the delayed signal supplied from the first delay circuit 33 is entered, for supplying a delayed enable control signal 133 resulting from the inversion of the entered delayed signal; and output means 100, into which the enable control signal 32 and the inverted and delayed enable control signal 133 are entered, capable of controlling the output state in either an enable state or a disable state.

Figure 19:
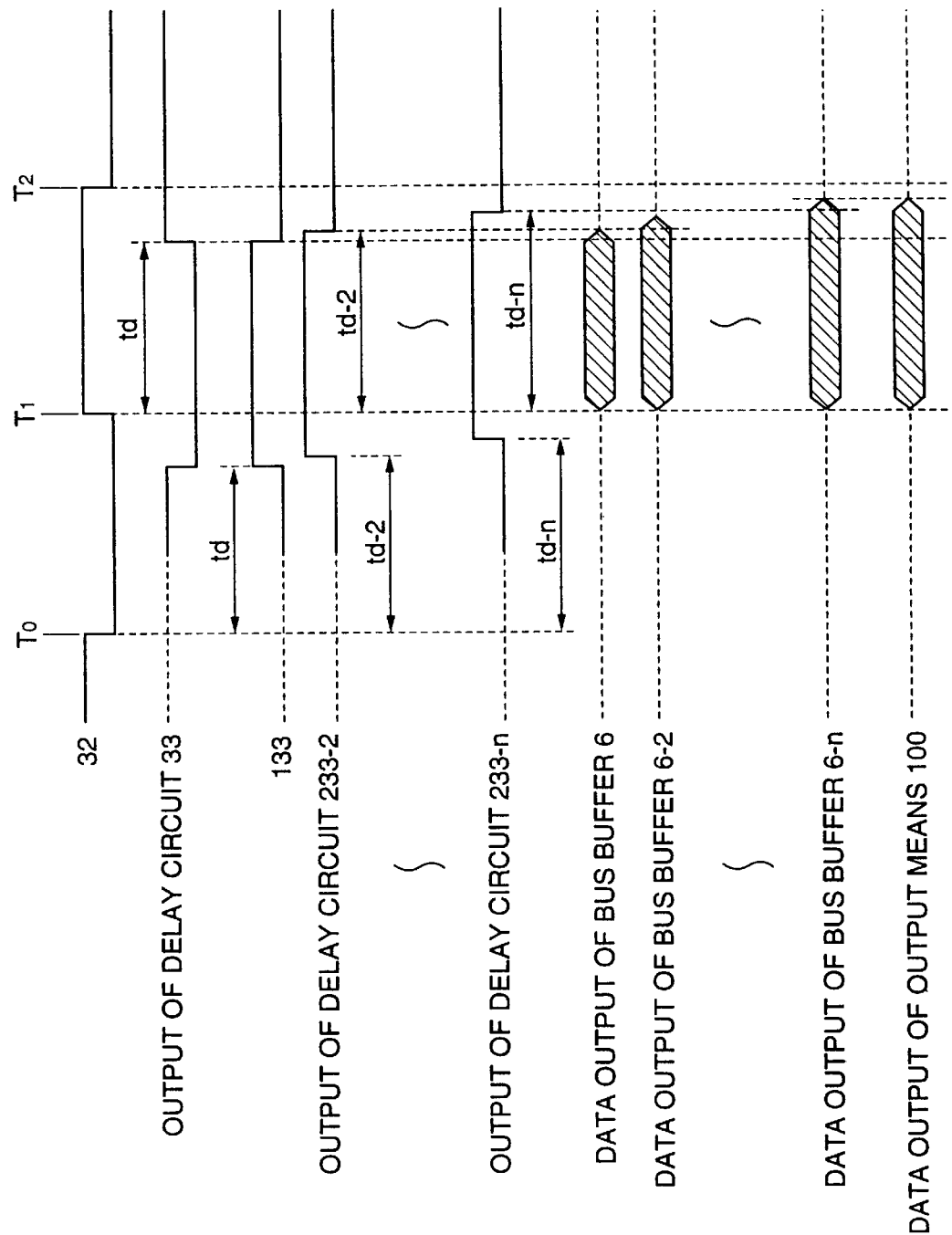
FIG. 19 is a block diagram illustrating a 10th preferred embodiment of the invention.

The output means 100 has a group of output buffers 6 to 6-n so configured that the output state of each individual output means can be controlled either in the enable or the disable state and the output terminals of the constituent output means can be connected in common to supply the same signals; a group of logic circuits 36 to 36-n for supplying the respective output buffers 6 to 6-n with control signals for switching between the enable and disable output states; and a group of second delay circuits 233-2 to 233-n successively connected so that the inverted and delayed enable control signal 133, entered from the inverter 131, be supplied as a plurality of signals successively further delayed within the extent of a second predetermined period (a differential length of time from td to td-n in FIG. 19).

Into each of the logic circuits 36 to 36-n is entered the enable control signal 32 in common, and a plurality of delayed signals, successively delayed and supplied from the inverter 131 and the group of second delay circuits 233-2 to 233-n, are individually entered.

The logic circuits 36 to 36-n are so configured as to switch the respective output states of all the output buffers 6 to 6-n simultaneously from the disable to the enable state in accordance with the enable control signal 32, and individually from the enable to the disable state in succession in accordance with the plurality of delayed signals supplied from the inverter 131 and the group of second delay circuits 233-2 to 233-n with successive lags.

To compare here the timing chart of FIG. 19, illustrating the operation of the embodiment shown in FIG. 18, with the timing chart of FIG. 10, illustrating that of the embodiment shown in FIG. 9, as the inverted enable control signal 133 is generated and entered successively into the group of second logic circuits 233-2 to 233-n in the operation illustrated in FIG. 19, the enable control signal 133 and the outputs of the group of second delay circuits 233-2 to 233-2 in FIG. 19 are reverse in polarity to the outputs of the first delay circuit 33 and the group of second delay circuits 233-2 to 233-n in FIG. 10.

Meanwhile, by making the input polarities of the group of logic circuits 36 to 36-n in FIG. 18 into which these signals are respectively entered reverse to those of the group of logic circuits 136 to 136-n in FIG. 9, the control signal outputs to the group of output buffers 6 to 6-n are made the same as one another to cause the data outputs of the group of output buffers 6 to 6-n in FIG. 19 to those of the group of output buffers 6 to 6-n in FIG. 10. Thus the part consisting of the inverter 131, the group of second delay circuits 233-2 to 233-n and the group of logic circuits 36 to 36-n in FIG. 18 corresponds to that composed of the group of second delay circuits 233-2 to 233-n and the group of logic circuits 136 to 136-n in FIG.2, and this second embodiment of the third output circuit according to the invention, shown in FIG. 18, provides the same operational effect as the earlier cited embodiment of the first output circuit according to the invention, illustrated in FIG. 3.

The part 100 consisting of the group of output buffers 6 to 6-n, the group of logic circuits 36 to 36-n, and the group of second delay circuits 233-2 to 233-n, shown in FIG. 18, corresponds to the output means 100 in FIG. 15, and the part 200 consisting of the part 100 and the inverter 131, shown in FIG. 18, corresponds to the output means 200 in FIG. 1.

Next is described in detail an 11th preferred embodiment of the present invention.

Figure 20:
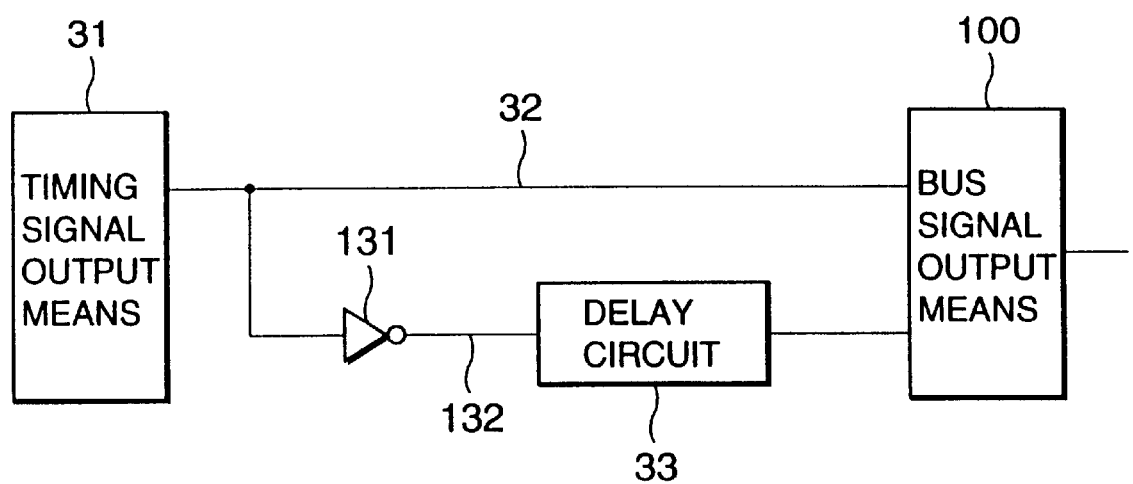
FIG. 20 is a timing chart of the 10th preferred embodiment of the invention.

Referring to FIG. 20, an output circuit, which is the 11th embodiment of the invention, basically comprises an inverter 131 for inverting an enable control signal 32, a delay circuit 33 for delaying by a first predetermined period (td in FIG. 2) the inverted enable control signal 32 supplied from the inverter 131; and output means 100 capable of controlling the output state in either an enable state or a disable state, wherein the output state of the output means 100 is switched by the enable control signal 32 from the disable to the enable state and by a delayed signal, supplied from the delay circuit 33, from the enable to the disable state.

Here the outline of the 11th embodiment 200 shown in FIG. 20 is equivalent to a version of the outline of the eighth embodiment of the invention shown in FIG. 15 wherein the order of the delay circuit 33 and the inverter 131 is reversed. the output means 100 and the inverter 131.

Now is described in detail a 12th preferred embodiment of the present invention.

Figure 21:
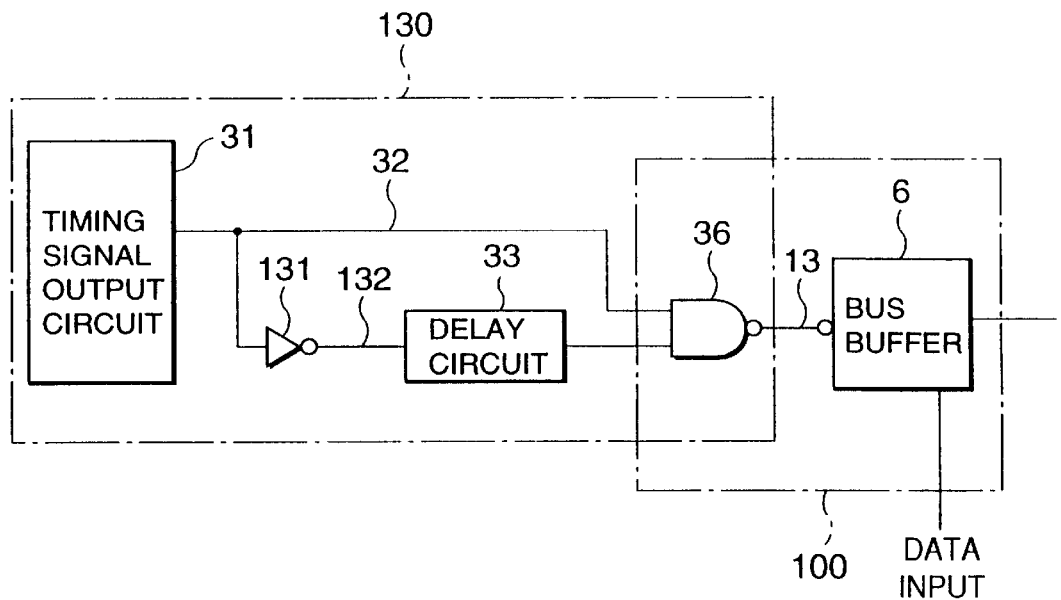
FIG. 21 is a block diagram illustrating an 11th preferred embodiment of the invention.

Referring to FIG. 21, an output circuit, which is the 12th embodiment of the invention, comprises an inverter 31 for inverting an enable control signal 32; a delay circuit 33 for delaying by a first predetermined period (td in FIG. 22) the inverted enable control signal 32 supplied from the inverter 131; a logic circuit 36, into which the enable control signal 32 and a delayed signal supplied from the delay circuit 33 are entered, for supplying an enable output control signal 13; and output buffers 6 capable of controlling the output state in either an enable state or a disable state with the enable output control signal 13, wherein the logic circuit 36 generates the enable output control signal 13 to switch the output state of the output buffers 6 from the disable to the enable state in accordance with the enable control signal 32 and from the enable to the disable state in accordance with the delayed signal supplied from the delay circuit 33. Here the output circuit shown in FIG. 22, which is the 12th embodiment of the invention, is equivalent to a version of the outline of the ninth embodiment of the invention shown in FIG. 16 wherein the order of the delay circuit 33 and the inverter 131 is reversed.

Figure 22:
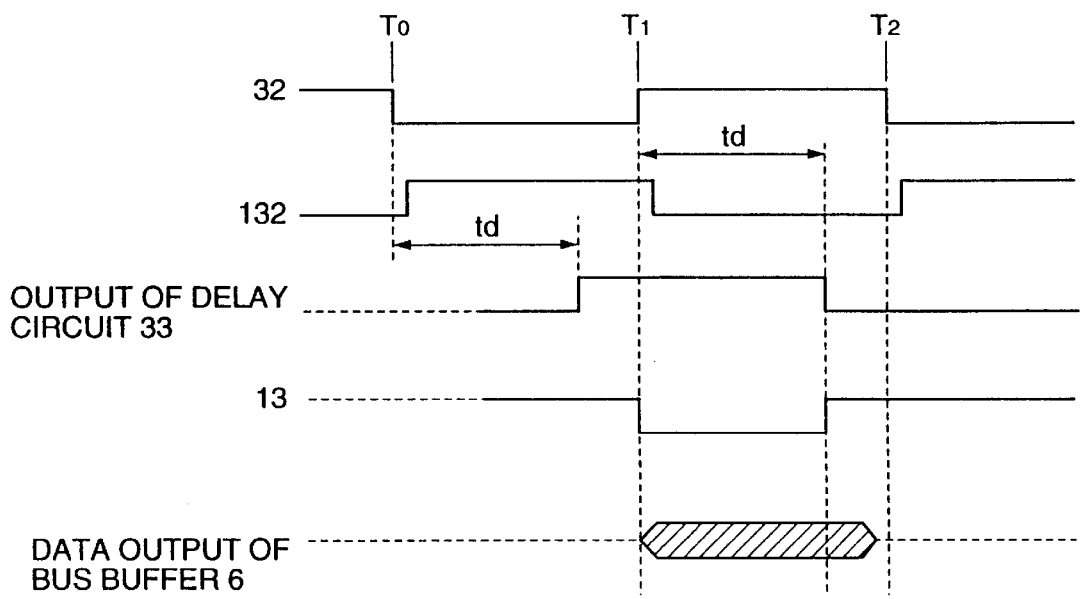
FIG. 22 is a timing chart of the 11th preferred embodiment of the invention.

Therefore, to compare the timing chart of FIG. 22, illustrating the operation of the embodiment shown in FIG. 21, with the timing chart of FIG. 17, illustrating that of the embodiment shown in FIG. 16, in the operation illustrated in FIG. 22, after the enable control signal 132 earlier inverted by the inverter 131 is generated, it is caused to go through the delay circuit 33 to be delayed by the first predetermined period td to generate the same signal as the enable control signal 133 resulting from the delaying and inversion of the enable control signal 32 in FIG. 17.

After that, as the logic circuit 36 and the output buffers 6 perform the same operation and provide the same data outputs, this output circuit shown in FIG. 21, which is the 12th embodiment of the invention provides the same operational effect as the output circuit shown in FIG. 16, which is the ninth embodiment of the invention. Thus this embodiment of the third output circuit of the invention, shown in FIG. 21, provides the same operational effect as the earlier cited embodiment of the second output circuit according to the invention, illustrated in FIG. 3. The part 100 consisting of the output means and the logic circuit, shown in FIG. 21, corresponds to the output means 100 in FIG. 20.

Next is described in detail a 13th preferred embodiment of the present invention.

Figure 23:
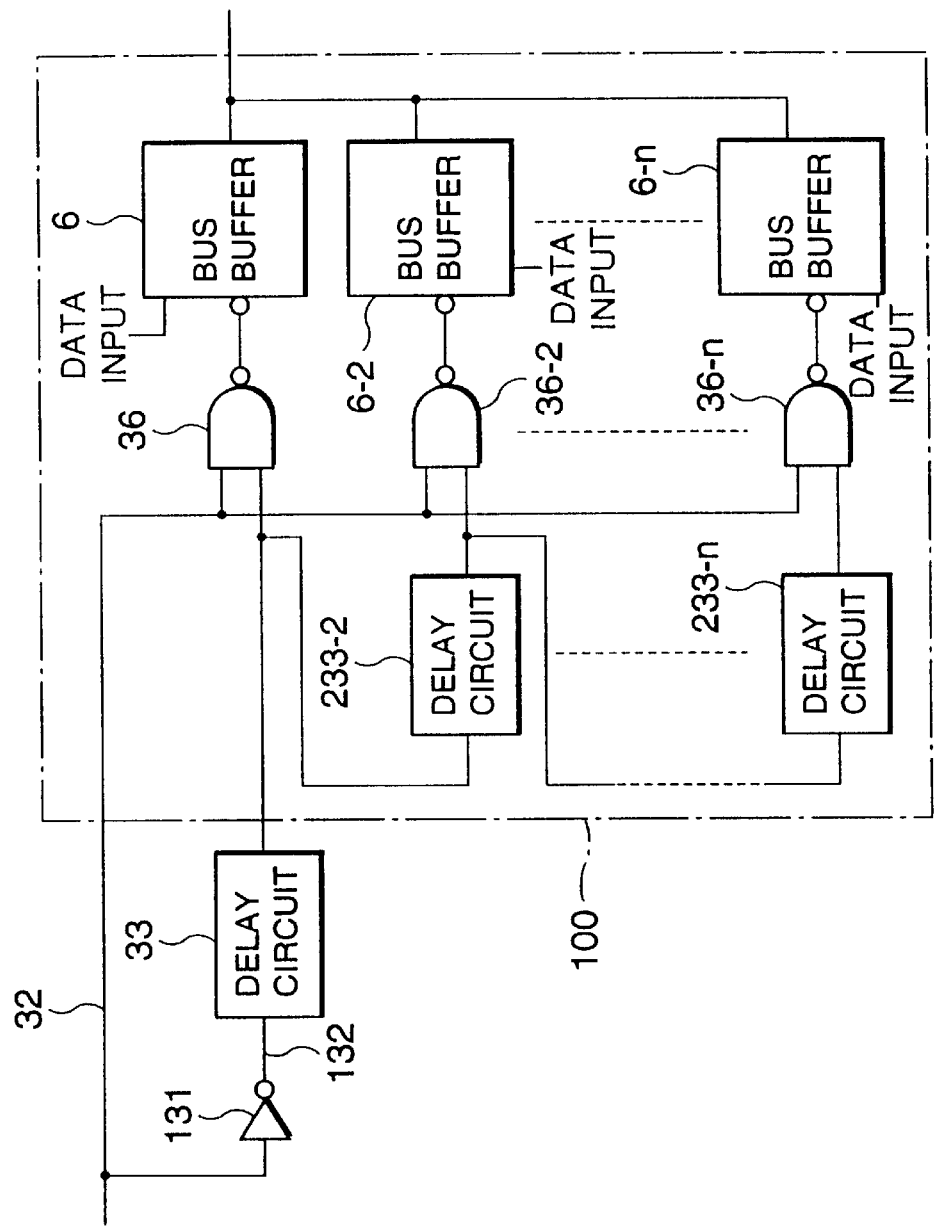
FIG. 23 is a block diagram illustrating a 12th preferred embodiment of the invention.

Referring to FIG. 23, an output circuit, which is the 13th embodiment of the invention, comprises an inverter 131 for inverting an enable control signal 32; a delay circuit 33 for delaying by a first predetermined period (td in FIG. 24) the inverted enable control signal 32 supplied from the inverter 131; and output means 100, into which the enable control signal 32 and the delayed signal supplied from the first delay circuit 33 are entered, capable of controlling the output state in either an enable state or a disable state.

The output means 100 has a group of output buffers 6 to 6-n so configured that the output state of each individual output means can be controlled either in the enable or the disable state and the output terminals of the constituent output means can be connected in common to supply the same signals; a group of logic circuits 36 to 36-n for supplying the respective output buffers 6 to 6-n with control signals for switching between the enable and disable output states; and a group of second delay circuits 233-2 to 233-n successively connected so that the output of the first delay circuit 33 be supplied as a plurality of signals successively further delayed within the extent of a second predetermined period (a differential length of time from td to td-n in FIG. 22).

Into each of the logic circuits 36 to 36-n is entered the enable control signal 32 in common, and a plurality of delayed signals, successively delayed and supplied from the first delay circuit 33 and the group of second delay circuits 233-2 to 233-n, are individually entered. The group of logic circuits 36 to 36-n are so configured as to switch the respective output states of all the output buffers 6 to 6-n simultaneously from the disable to the enable state in accordance with the enable control signal 32, and individually from the enable to the disable state in succession in accordance with the plurality of delayed signals supplied from the first delay circuit 33 and the group of second delay circuits 233-2 to 233-n with successive lags.

Here the output circuit shown in FIG. 23, which is the 13th embodiment of the invention, is equivalent to a version of the 10th embodiment of the invention shown in FIG. 18 wherein the order of the first delay circuit 33 and the inverter 131 is reversed, and the output means 100 consisting of the group of second delay circuits 233-2 to 233-n, the group of logic circuits 36 to 36-n and the group of output buffers 6 to 6-n are the same.

Figure 24:
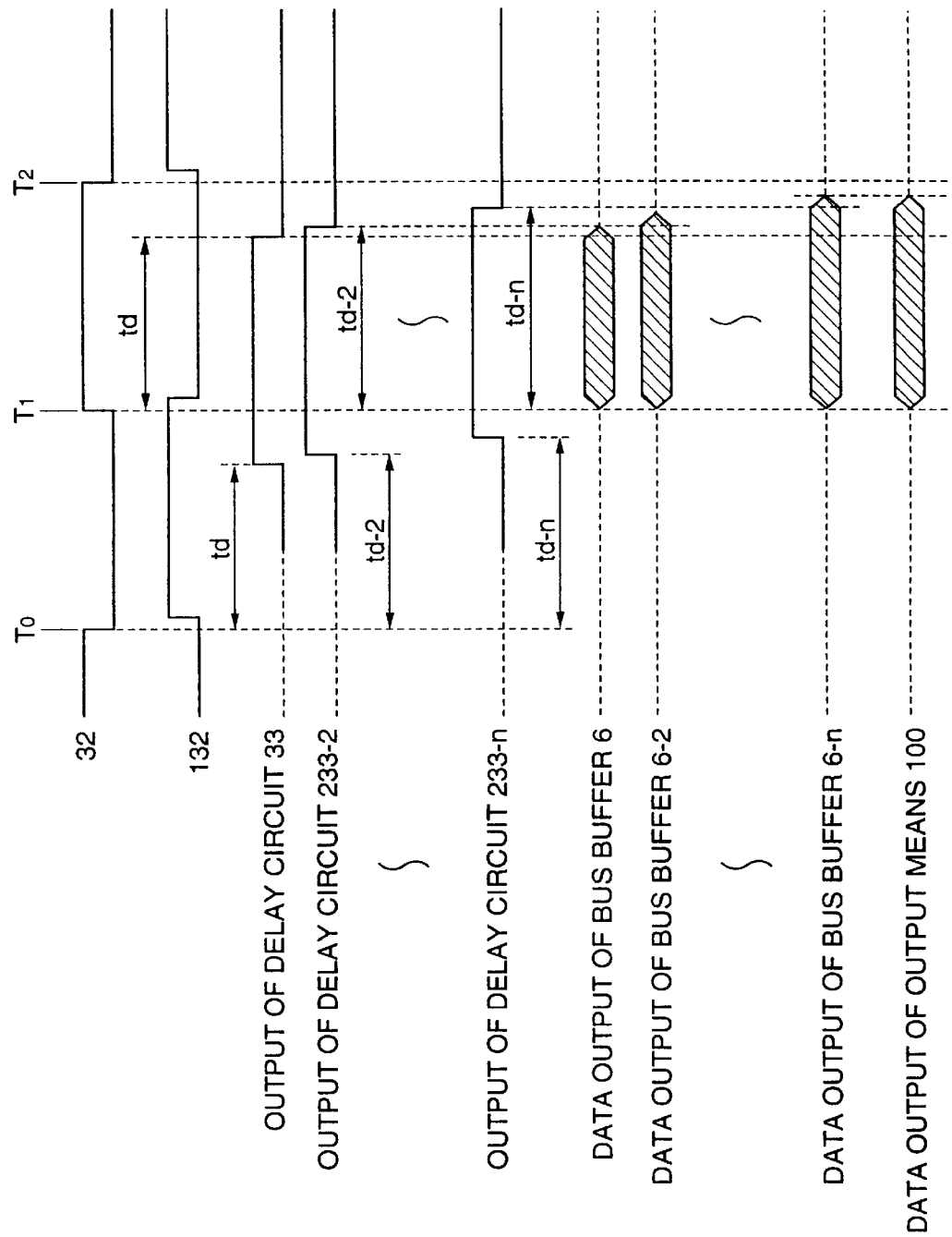
FIG. 24 is a timing chart of the 12th preferred embodiment of the invention.

Therefore, to compare the timing chart of FIG. 24, illustrating the operation of the embodiment shown in FIG. 23, with the timing chart of FIG. 19, illustrating that of the embodiment shown in FIG. 18, in the operation illustrated in FIG. 24, after the enable control signal 132 earlier inverted by the inverter 131 is generated, it is caused to go through the first delay circuit 33 to be delayed by the first predetermined period td to generate the same signal as the enable control signal 133 resulting from the delaying and inversion of the enable control signal 32 in FIG. 19.

After that, as the group of second delay circuits 233-2 to 233-n, the group of logic circuits 36 to 36-n and the group of output buffers 6 to 6-n perform the same operation and, as output means 100, provide the same data outputs, this output circuit shown in FIG. 23, which is the 13th embodiment of the invention, provides the same operational effect as the output circuit shown in FIG. 18, which is the 10th embodiment of the invention. Thus this third embodiment of the third output circuit of the invention, shown in FIG. 23, provides the same operational effect as the output circuit illustrated in FIG. 9, which is the fifth embodiment of the invention.

The part 100 consisting of the group of second delay circuits 233-2 to 233-n, the group of logic circuits 36 to 36-n and the output buffers 6 to 6-n, shown in FIG. 23, corresponds to the output means 200 in FIG. 9.

Now is described in detail a 14th preferred embodiment of the present invention.

Figure 25:
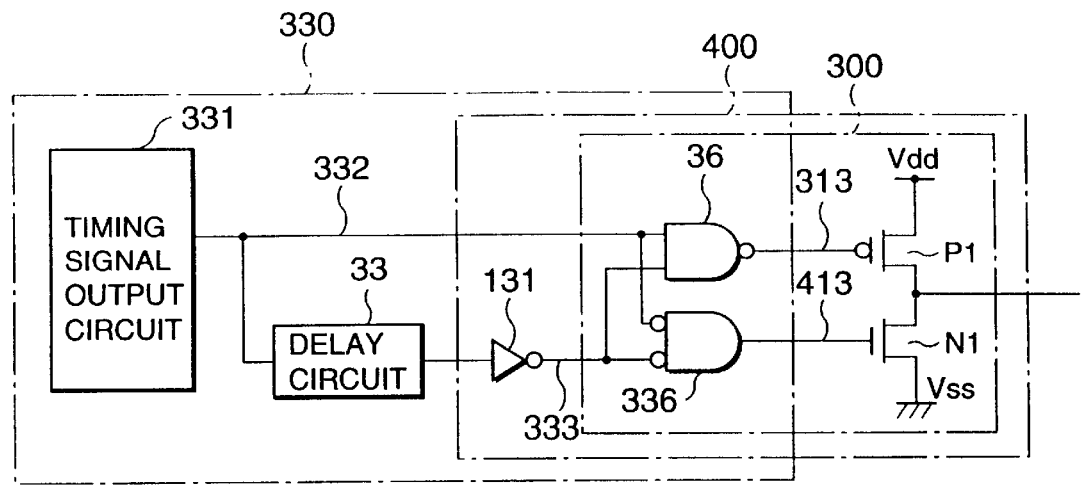
FIG. 25 is a block diagram illustrating a 13th preferred embodiment of the invention.

Referring to FIG. 25, an output circuit, which is the 14th embodiment of the invention, comprises a delay circuit 33 for delaying an output state control signal 332, corresponding to the enable control signal 32 in FIG. 16, by a first predetermined period (td in FIG. 26); an inverter 131, into which a delayed signal supplied from the delay circuit 33 is entered, for supplying an inverted and delayed signal 333; a logic circuit 36, into which the output state control signal 332 and the inverted and delayed output state control signal 333 are entered, for supplying a High level output control signal 313; another logic circuit 336, into which the output state control signal 332 and the inverted and delayed output state control signal 333 are entered, for supplying a Low level output control signal 413; High level output means P1 capable of controlling the output state in a High level enable or disable state with the High level output control signal 313; and Low level output means N1 capable of controlling the output state in a Low level enable or disable state with the Low level output control signal 413.

The logic circuit 36 generates the High level output control signal 313 to switch the output state of the High level output means P1 from the disable to the enable state at the timing of the transition of the output state control signal 332 to the High level and from the enable to the disable state with the output state control signal 333, resulting from the inversion by the inverter 131 of the delayed signal supplied from the delay circuit 33.

The logic circuit 336 generates the Low level output control signal 413 to switch the output state of the Low level output means N1 from the disable to the enable state at the timing of the transition of the output state control signal 332 to the Low level and from the enable to the disable state with the output state control signal 333, resulting from the inversion by the inverter 131 of the delayed signal supplied from the delay circuit 33.

Here the part 300 shown in FIG. 25 consisting of the High level output means P1, the Low level output means N1 and the logic circuits 36 and 336 corresponds to the output means 100 in FIG. 15. Therefore, the part composed of the part 300 and the inverter circuit 131 in FIG. 25 corresponds to the output means 200 in FIG. 1.

Now the operation of this embodiment is described below.

Figure 26:
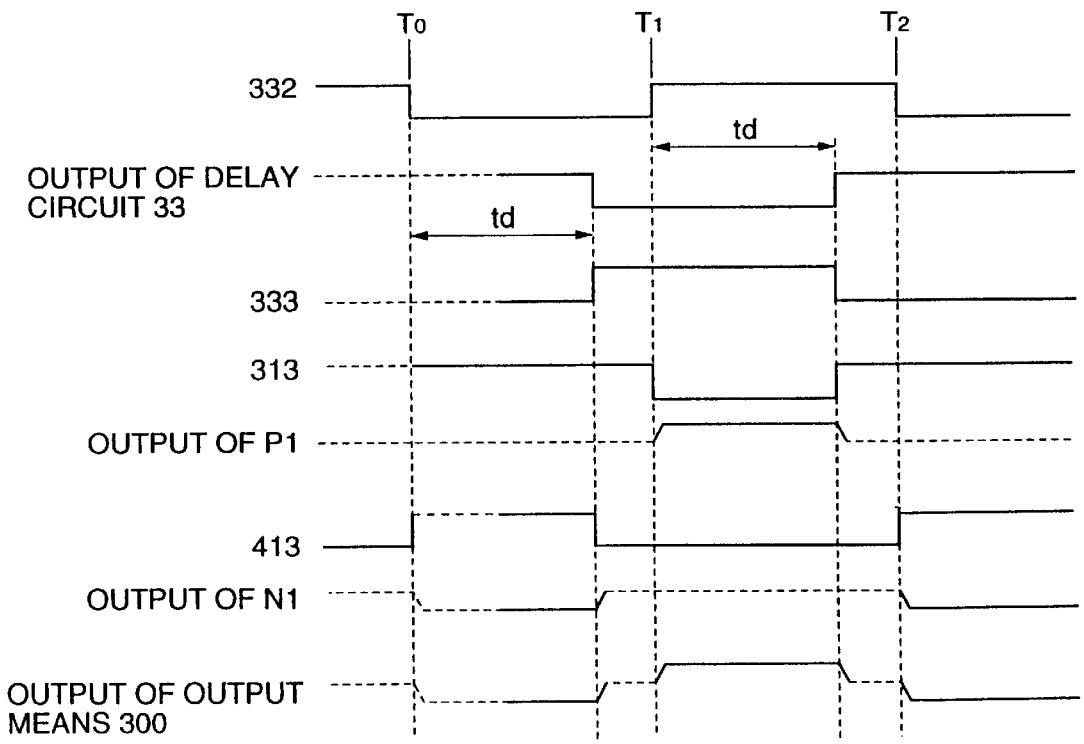
FIG. 26 is a timing chart of the 13th preferred embodiment of the invention.

Referring to FIG. 26, in the output circuit illustrated therein, which is the 14th embodiment of the invention, the output signal of the delay circuit 33 is behind the output state control signal 332, which is the input signal, by a first predetermined period td. The output signal of the delay circuit 33 is inverted by the inverter 131 into the output state control signal 333.

First, from a point of time T0 at which the output state control signal 332 takes on the Low level till the point of time T1, the High level output control signal 331 of negative logic, generated and supplied by the logic circuit 36 on the basis of the output state control signals 332 and 333, is in an inactivated state, and the output of the High level output means P1, into which the High level output control signal 313 is entered, is in the disable state.

Meanwhile, the Low level output control signal 413 of positive logic, generated and supplied by the logic circuit 336 on the basis of the output state control signals 332 and 333, is in an activated state only for the pulse width td from the point of time T0, and the output of the Low level output means N1, into which the Low level output control signal 413 is entered, is in the enable state of the Low level only for the pulse width td from the point of time T0.

Therefore, the output state of the output means 300, to which the outputs of the High level output means P1 and the Low level output means N1 are connected in common, is in the enable state of the Low level only for the pulse width td from the point of time T0, and is in the disable state after the lapse of td until the point of time T1.

Next, from the point of time T1 at which the output state control signal 332 varies to the High level till the point of time T2, the High level output control signal 331 of negative logic, generated and supplied by the logic circuit 36 on the basis of the output state control signals 332 and 333, is in an activated state only for the pulse with td from the point of time td, and the output of the High level output means P1, into which the High level output control signal 313 is entered, is in the enable state of the High level only for the pulse width td from the point of time T1.

Meanwhile, the Low level output control signal 413 of positive logic, generated and supplied by the logic circuit 336 on the basis of the output state control signals 332 and 333, remains in an inactivated state, and the output of the Low level output means N1, into which the Low level output control signal 413 is entered, is in the disable state of the Low level only for the pulse width td from the point of time T0. Therefore, the output state of the output means 300, to which the outputs of the High level output means P1 and the Low level output means N1 are connected in common, is in the enable state of the High level only for the pulse width td from the point of time T1, and then turns into the disable state.

To sum up the foregoing, the switching of the data output state of the output means 300 from the disable to the enable state takes place immediately (at the point of time T0 or T1) in accordance with the output state control signal 332. Meanwhile the switching of the data output states of the output means 300 from the enable to the disable state takes place behind the point of time T0 or T1 by the first predetermined period td in accordance with the output state control signal 333 resulting from the inversion of the delayed signal supplied from the delay circuit 33.

As described above, this output circuit according to the first aspect of the invention allows the data output state of the output means 300 to be controlled in either the enable or the disable state, and can be used as output circuit for driving the common signal line of a bus circuit. When so used, as the enable timing T0 or T1 at which the data output state of the output means 300 is switched from the disable to the enable state is not delayed, the delay time of signal communication by the bus circuit is not increased. Furthermore, bus fights can be securely prevented by setting said first predetermined period td shorter than the length of time from the enable timing T0 or T1 of this output circuit till T1 or T2 when another output circuit takes on an enable state in the next cycle.

Next is described in detail a 15th preferred embodiment of the present invention.

Figure 27:
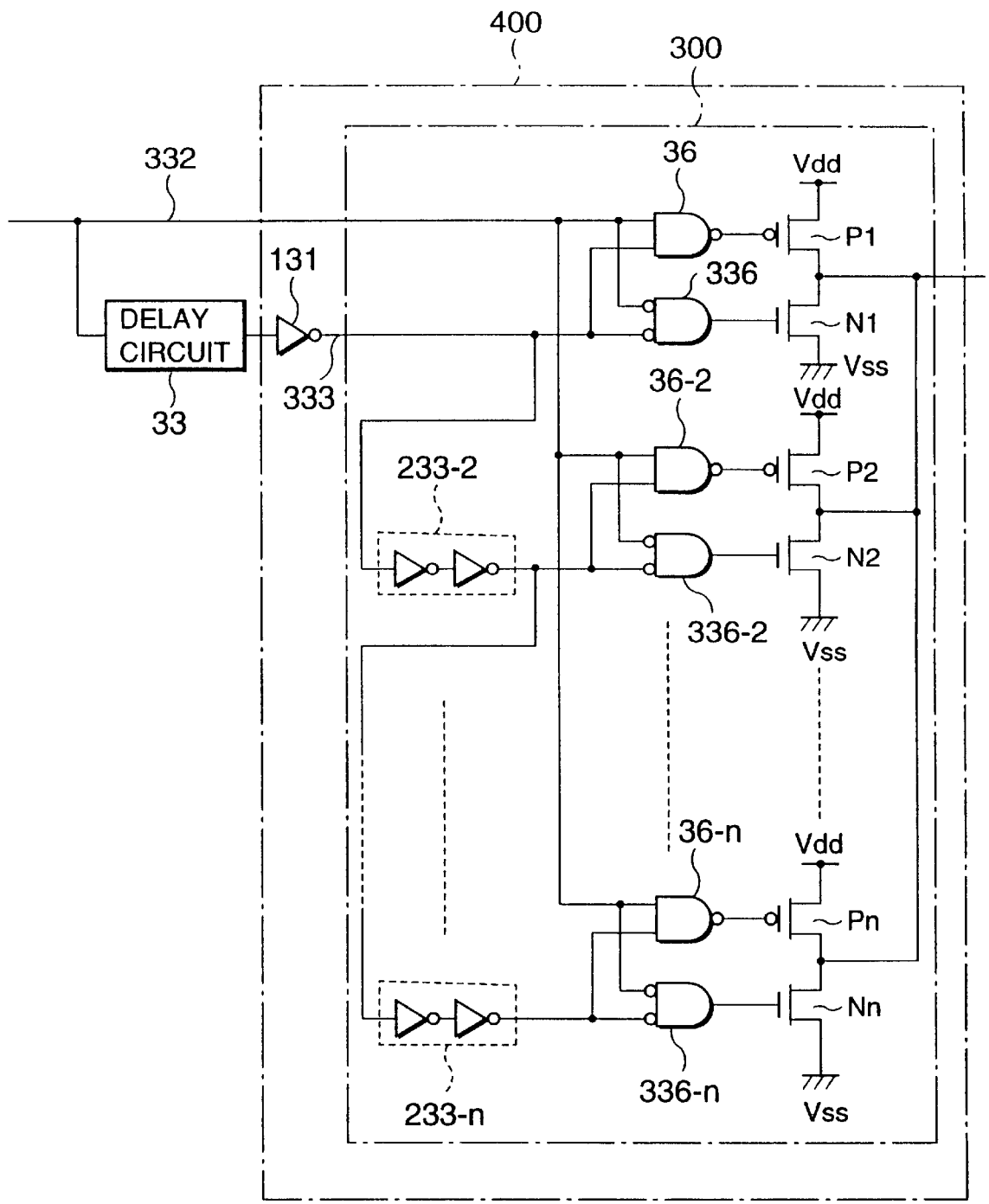
FIG. 27 is a block diagram illustrating a 14th preferred embodiment of the invention.

Referring to FIG. 27, an output circuit, which is the 15th embodiment of the invention, comprises a first delay circuit 33 for delaying an output state control signal 332 corresponding to the enable control signal 32 in FIG. 18, by a first predetermined period (td in FIG. 28); an inverter 131, into which a delayed signal supplied from the delay circuit is entered, for supplying an output state control signal 333 resulting from the inversion and delaying of the entered signal; a group of second delay circuits 232-2 to 232-n successively connected so that the output of the inverter 131, which is the inverted and delayed output state control signal 333, be supplied as a plurality of signals successively further delayed within the extent of a second predetermined period (a differential length of time from td to td-n in FIG. 28); a group of logic circuits 36 and 36-2 to 36-n, into which the output state control signal 332 is entered in common, and a plurality of delay signals supplied from the inverter 131 and the group of second delay circuits 233-2 to 233-n delayed in succession are respectively entered individually; another group of logic circuits 336 and 336-2 to 336-n, into which similarly the output state control signal 332 is entered in common, and the plurality of delay signals supplied from the inverter 131 and the group of second delay circuits 233-2 to 233-n delayed in succession are respectively entered individually; High level output means P1 to Pn capable of individually controlling the output states in a High level enable or disable state with the control signals respectively supplied by the group of logic circuits 36 and 36-2 to 36-n; and Low level output means N1 to Nn similarly capable of individually controlling the output states in a Low level enable or disable state with the control signals respectively supplied by the group of logic circuits 336 and 336-2 to 336-n.

It is so configured that all the output terminals of the High level output means P1 to Pn and of the Low level output means N1 to Nn are connected in common to supply the same signal, which is made the output signal of the output means 300.

In particular, the output circuit illustrated in FIG. 27, i.e. the 15th embodiment of the present invention, is characteristic in that the group of logic circuits 36 and 36-2 to 36-n switch the respective output states of the group of High level output means P1 to Pn from the disable to the enable state all at the same time at the timing of transition of the output state control signal 332 to the High level, and individually from the enable to the disable state in succession in accordance with the output state control signal 333 and the plurality of delayed signals supplied from the group of second delay circuits 233-2 to 233-n delayed in succession, and in that, similarly, the group of logic circuits 336 and 336-2 to 336-n switch the respective output states of the group of Low level output means N1 to Nn from the disable to the enable state all at the same time at the timing of transition of the output state control signal 332 to the Low level, and individually from the enable to the disable state in succession in accordance with the output state control signal 333 and the plurality of delayed signals supplied from the group of second delay circuits 233-2 to 233-n delayed in succession.

Here the part 300 shown in FIG. 27 consisting of the High level output means P1 to Pn; the Low level output means N1 to Nn; the groups of logic circuits 36, 36-2 to 36-n and 336 and 336-2 to 336-n; and the group of second delay circuits 233-2 to 233-n corresponds to the output means 100 in FIG. 15. Therefore, the part 400 composed of the part 300 and the inverter circuit 131 in FIG. 27 corresponds to the output means 200 in FIG. 1.

Now the operation of this embodiment is described below.

Figure 28:
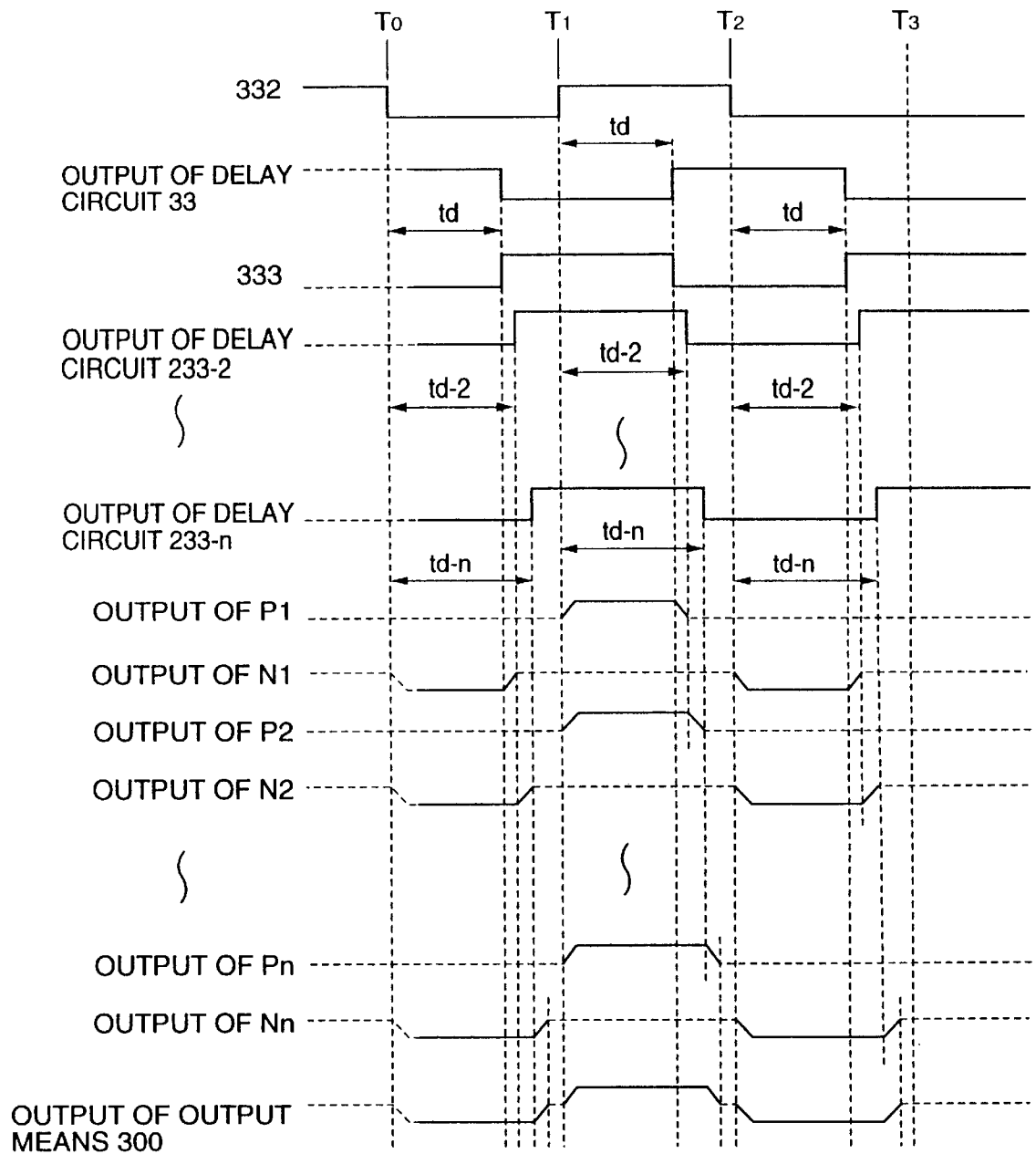
FIG. 28 is a timing chart of the 14th preferred embodiment of the invention.

Referring to FIG. 28, in the output circuit illustrated therein, which is the 15th embodiment of the invention, the output signal of the delay circuit 33 is behind the output state control signal 332, which is the input signal, by the first predetermined period td. The output signal of the delay circuit 33 is inverted by the inverter 131 into the output state control signal 333. Then the plurality of delay signals supplied successively from the group of delay circuits 233-2 to 233-n connected in succession are signals resulting from further successive delaying the output state control signal 333 within the extent of the second predetermined period (a differential length of time from td to td-n in FIG. 28).

First, from a point of time T1 at which the output state control signal 332 takes on the High level till the timing of T2, the outputs of the High level output means P1 to Pn, controlled by the group of logic circuits 36 and 36-2 to 36-n on the basis of the output state control signals 332 and 333 or the plurality of delayed signals successively supplied by the group of delay circuits 233-2 to 233-n, are in the High level enable state for the pulse width td or td-2 to td-n from the point of time T1.

Meanwhile, all the outputs of the Low level output means N1 to Nn, controlled by the group of logic circuits 336 and 336-2 to 336-n on the basis of the output state control signals 332 and 333 or the plurality of delayed signals successively supplied by the group of delay circuits 233-2 to 233-n, remain in the disable state.

Therefore, the output state of the output means 300, to which the outputs of the High level output means P1 to Pn and the Low level output means N1 to Nn are connected in common, takes on the enable state of the High level immediately at the point of time T1, and returns to the disable state in a phased manner after the first prescribed point of time td during the second predetermined period (a differential length of time from td to td-n).

Next, from the point of time T2 at which the output state control signal 332 varies to the Low level till the point of time T3, all the outputs of the High level output means P1 to Pn, controlled by the group of logic circuits 36 and 36-2 to 36-n on the basis of the output state control signals 332 and 333 or the plurality of delayed signals successively supplied by the group of delay circuits 233-2 to 233-n, remain in the disabled state.

Meanwhile, the outputs of the Low level output means N1 to Nn, controlled by the group of logic circuits 336 and 336-2 to 336-n on the basis of the output state control signals 332 and 333 or the plurality of delayed signals successively supplied by the group of delay circuits 233-2 to 233-n, are in the enable state of the Low level only for the pulse width td or td-2 to td-n from the point of time T1. Therefore, the output state of the output means 300, to which the outputs of the High level output means P1 to Pn and the Low level output means N1 to Nn are connected in common, turns into the enable state of the Low level immediately at the point of time T1, and returns to the disable state in a phased manner in the second predetermined period (a differential length of time from td to td-n) after the first predetermined period td.

Thus, the switching of the data output state of the output means 300 from the disable to the enable state takes place immediately (at the timing of T1 or T2) in accordance with the output state control signals 332.

Meanwhile, the switching of the data output state of the output means 300 from the enable to the disable state takes place in a phased manner during the second predetermined period (a differential length of time from td to td-n) after lagging behind the timing of time T1 or T2 in the diagram by the first predetermined period td in accordance with the output state control signal 333 resulting from the inversion of the delayed signal supplied from the delay circuit 33.

As described above, one embodiment of the third aspect of the invention allows the data output state of the output means 300 to be controlled in either the enable or the disable state, and can be used as output circuit for driving the common signal line of a bus circuit. When so used, as the enable timing T0 or T1 at which the data output state of the output means 300 is switched from the disable to the enable state is not delayed, the delay time of signal communication by the bus circuit is not increased. Furthermore, bus fights can be securely prevented by setting said first predetermined period td shorter than the length of time from the enable timing T1 or T2 of this output circuit till T2 or T3 when another output circuit takes on an enable state in the next cycle.

In addition, particularly even if a transitional load driving current remains on the common signal line of the bus circuit in the second predetermined period (a differential length of time from td to td-n) after said first predetermined period, the generation of switching noise can be reduced because, as stated above, the switching of the first output means 300 from the enable to the disable state takes place in a phased manner.

This makes it possible to set the total (td-n) of said first predetermined period and second length of time substantially equal to the length of time taken by the transitional driving current arising on the common signal line of the bus circuit to disappear, and enhance the transmission efficiency by minimizing the operating cycle time (T2–T1 or T3–T2) of the bus circuit.

Next a modification of the present invention is described below.

FIGS. 29 to 32 illustrate an example of delay circuit 33 supplying input signals delayed a prescribed length of delay time td as representative of the delay circuits 33, 33-2 to 33-n and 233-2 to 233-n. Incidentally, it is evident that, if the prescribed length of delay time td is altered, it may be deemed to be an example of another delay circuit out of 33-2 to 33-n and 233-2 to 233-n.

Figure 29A:
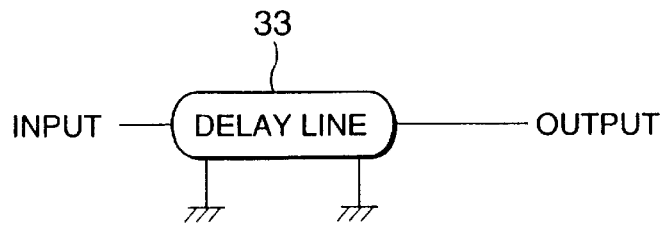
FIGS. 29A and B are a circuit diagram illustrating one example of delay circuit according to the invention and a timing chart illustrating its operation, respectively.
Figure 29B:
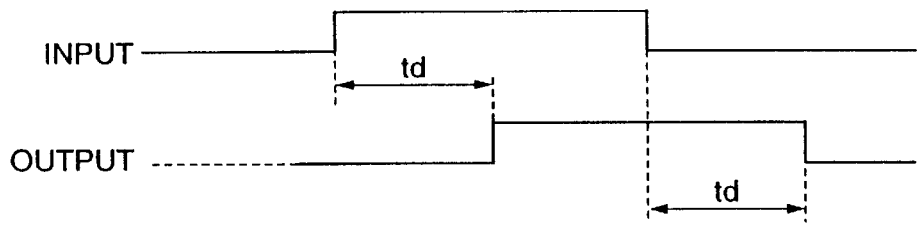

FIGS. 29(A) and 29(B) are respectively a diagram showing the configuration of one example of delay circuit according to the invention and a timing chart illustrating its operation.

Referring to FIG. 29, the example of delay circuit 33 according to the invention consists of a delay line 33 having a certain length of signal propagation delay time td. Input signals entered into the delay line 33 are delayed by the prescribed length of delay time td and supplied as Output signals.

Figure 30A:
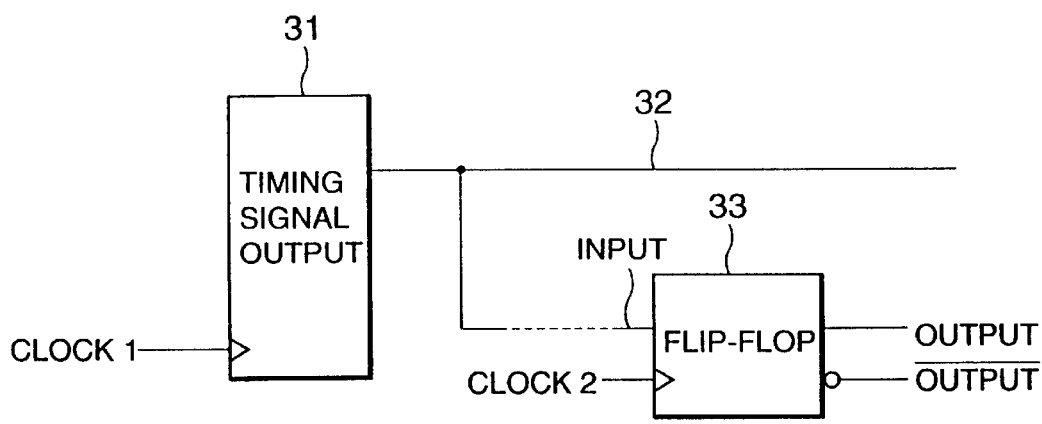
FIGS. 30A and B are a circuit diagram illustrating another example of a delay circuit according to the invention and a timing chart illustrating its operation, respectively.
Figure 30B:
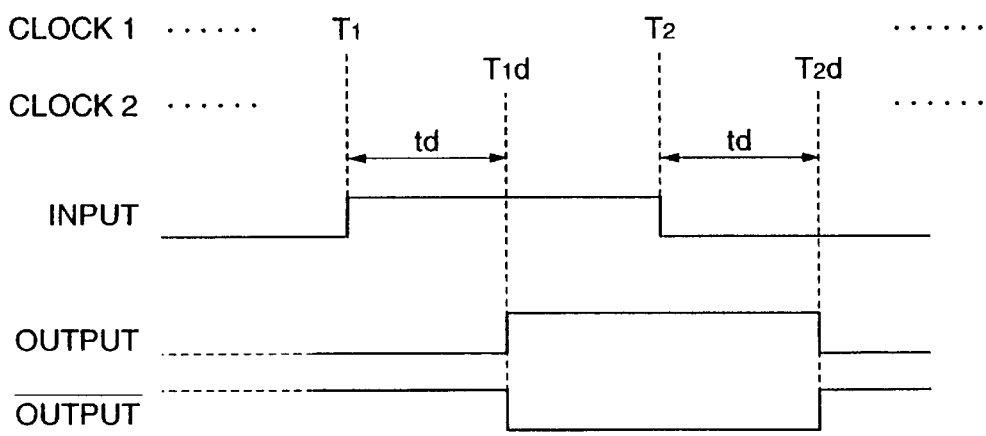

FIGS. 30(A) and 30(B) are respectively a diagram showing the configuration of another example of delay circuit according to the invention and a timing chart illustrating its operation.

Referring to FIG. 30, the other example of delay circuit 33 according to the invention consists of a synchronizing circuit, such as a flip-flop circuit, which operates on the basis of a reference clock signal Clock 2 behind another reference clock signal Clock 1, determining the timing signals for the invention (including T1 and T2), delayed by a certain degree of phase, and supplies the entered timing signals (including T1 and T2) according to the invention, delayed by the predetermined period td.

The underlying principle is that, by causing the synchronizing circuit 33, which is a flip-flop circuit or the like, to operate with the reference clock signal Clock 2 whose phase is behind that of another reference clock signal Clock 1, determining the timings of Input signals to the synchronizing circuit 33, by the prescribed length of delay time td, the Output signals from the synchronizing circuit 33 operate at timings (T1d, T2d and so forth) behind the timings T1, T2 and so on of the Input signals.

Figure 31A:
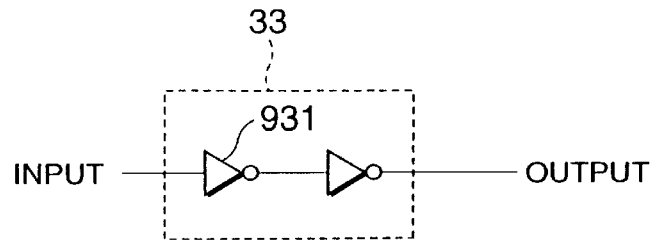
FIGS. 31A and B are a circuit diagram illustrating still another example of a delay circuit according to the invention and a timing chart illustrating its operation, respectively.
Figure 31B:
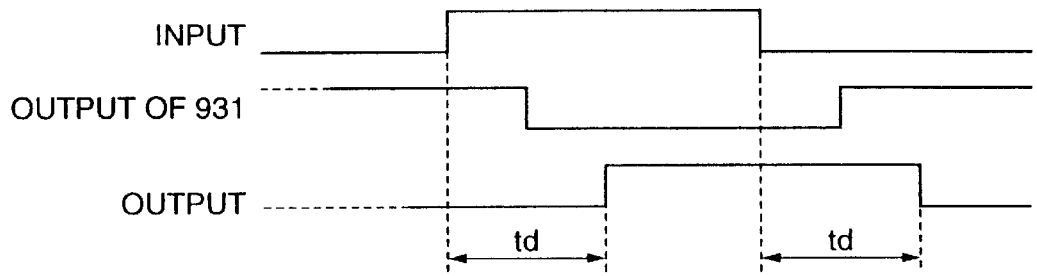

FIGS. 31(A) and 31(B) are respectively a diagram showing the configuration of still another example of delay circuit according to the invention and a timing chart illustrating its operation.

Referring to FIG. 31, the still other example of delay circuit 33 according to the invention consists of a group of logic circuits 33 having a certain length of signal propagation delay time td. FIG. 31 illustrates an instance in which the group of logic circuits 33 consists of two logic circuits (inverters) 931 or the like. Input signals entered into the group of logic circuits 33 are delayed by the prescribed length of delay time td and supplied as Output signals.

Hereupon it is to be noted that, where output circuits according to the invention are to be used in integrated circuits or the like, each consisting of many logic circuits, delay circuits each composed of a group of logic circuits, such as illustrated in FIG. 31, should be desirably used to facilitate manufacturing. In the block diagram of FIG. 27 illustrating an embodiment of the above-described third aspect of the invention, delay circuits each comprising a group of logic circuits shown in FIG. 31 are used as group of second delay circuits 233-2 to 233-n.

Figure 32A:
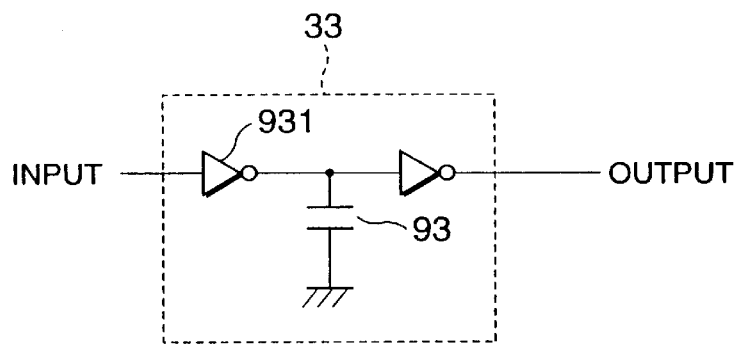
FIGS. 32A and B are a circuit diagram illustrating yet another example of a delay circuit according to the invention and a timing chart illustrating its operation, respectively.
Figure 32B:
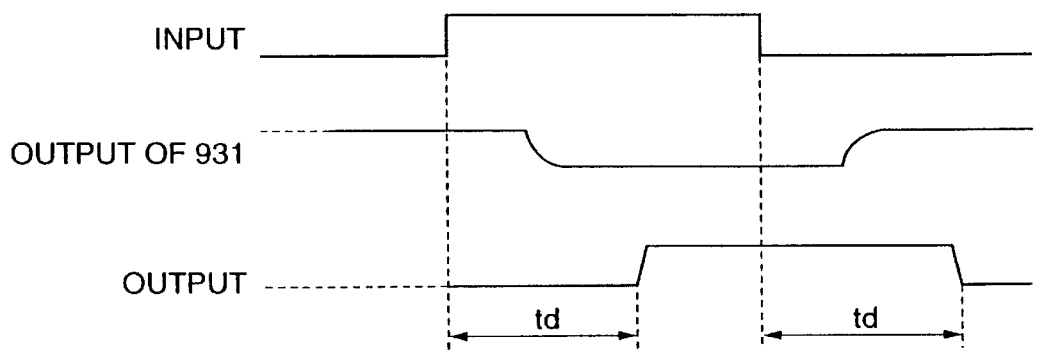
Figure 33:
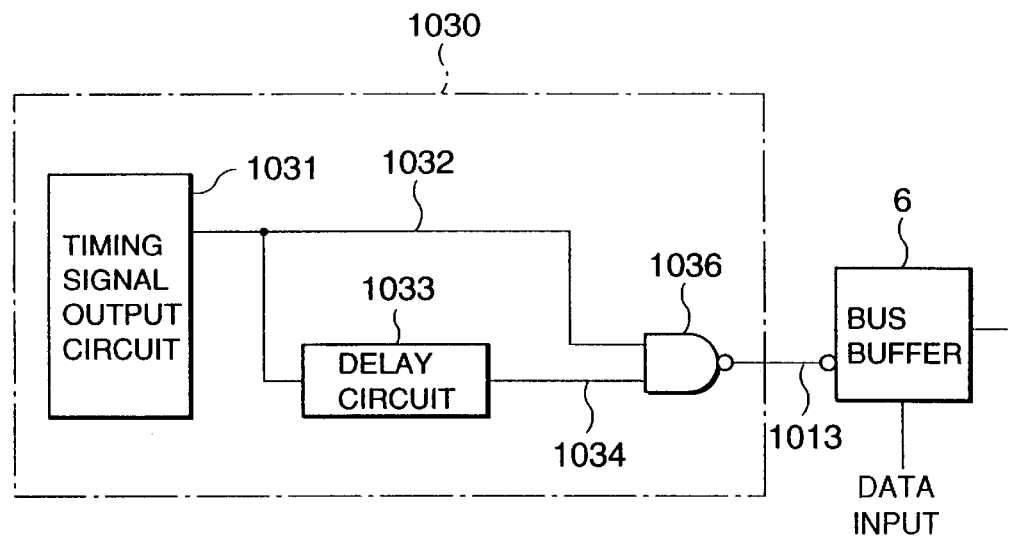
FIG. 33 is a block diagram illustrating an output circuit according to the prior art.
Figure 34:
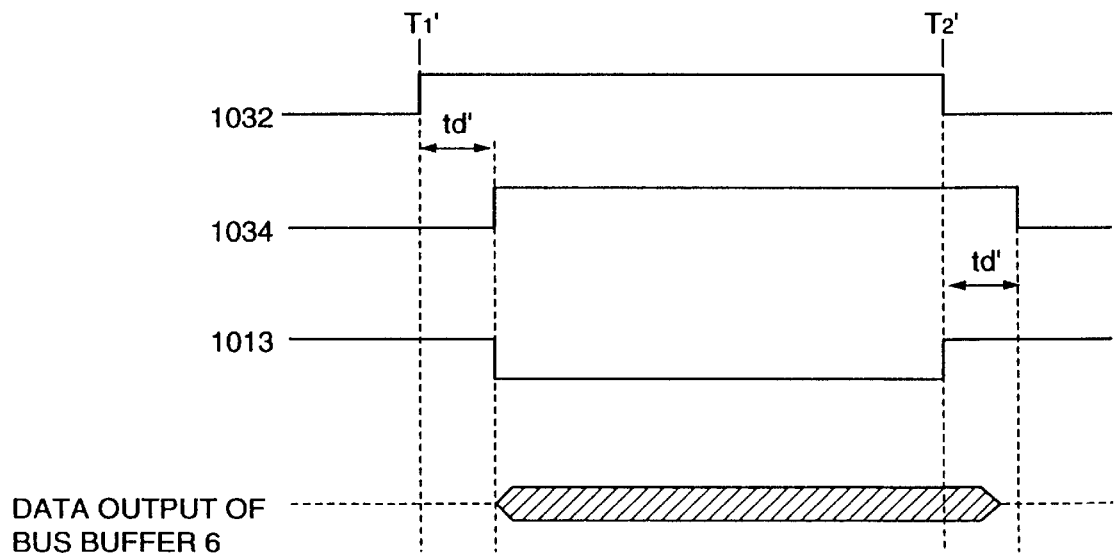
FIG. 34 is a timing chart of the output circuit according to the prior art.

FIGS. 32(A) and 32(B) are respectively a diagram showing the configuration of yet another example of delay circuit according to the invention and a timing chart illustrating its operation.

Referring to FIG. 32, the yet other example of delay circuit 33 according to the invention consists of an analog circuit (capacitor or the like) 33 which takes a certain length time to achieve a prescribed signal level. FIG. 32 illustrates an example in which the delay circuit 33 consisting of a group of logic circuits, as shown in FIG. 31, to which a capacitor 93 is additional connected. As the capacitor 93 takes a certain length of time to achieve a prescribed signal level when a signal voltage is applied to it, it can be utilized to intentionally elongate the prescribed length of delay time td.

As hitherto described, the present invention provides the following benefits.

By using an output circuit according to the invention for driving the common signal line of a bus circuit, bus fights can be securely prevented. This makes it possible to eliminate wasteful power consumption due to bus fights and realize a highly reliable bus circuit free from troubles such as element destruction or data errors.

The reason is that, in an output circuit according to the invention, the timing of switching the output state of the output circuit from the enable to the disable state is so controlled as to be earlier than that of another output circuit, connected to drive the common signal line of the bus circuit, to take on the enable state in the next time by setting (the total of the second predetermined period and) the first predetermined period of the first (and the second) delay circuit(s).

Also, an output circuit according to the invention does not elongate the signal communication delay time of the bus circuit. This makes it possible to securely prevent bus fights, eliminate wasteful power consumption, and thereby realize a bus circuit increased in both reliability and speed.

The reason is that the enable timing of switching the output state of the output means from the disable to the enable state is not delayed.

Moreover, an output circuit according to the invention does no extend the operating cycle time of the bus circuit. This makes it possible to securely prevent bus fights, eliminate wasteful power consumption, and thereby realize a bus circuit increased in both reliability and transmission efficiency.

The reason is that it has means to accomplish gradually (or in a phased manner) in a second predetermined period the control to switch the output state of the output means from the disable to the enable state. As the action of this means accomplishes gradually (or in a phased manner) the switching of the output means from the disable to the enable state as described above even if a transitional load driving current remains on the common signal line of the bus circuit, the generation of so-called switching noise can be reduced. This makes it possible to set the total of said first and second prescribed lengths of time substantially equal to the length of time taken by the transitional driving current arising on the common signal line of the bus circuit to disappear, and thereby to minimize the operating cycle time of the bus circuit to enhance the transmission efficiency.

An output circuit according to the invention has first output means (200 in FIGS. 1, 7 and 2, and 6 to 6-n in FIG. 13) capable of controlling the output state in the enable or the disable state.

Therefore, the output circuit according to the invention can be used for driving the common signal line of a bus circuit.

In particular, in the output circuit according to the invention, the output state of said first output means (200 in FIGS. 1, 7 and 2, and 6 to 6-n in FIG. 13) can be switched from the disable to the enable state with an enable control signal (32 in FIGS. 1, 7, 2 and 13).

Hereupon, to describe an output circuit according to the third aspect of the invention in detail, it has a group of second output means (6 to 6-n in FIG. 2) so controlled as to switch the output state of each from the disable to the enable state with said enable control signal (32 in FIGS. 1 and 2), and the output terminals of second output means (6 to 6-n in FIG. 2) are connected in common to constitute the output of said first output means (200 in FIGS. 1 and 2), so that, when the output state of said first output means (200 in FIGS. 1 and 2) is to be switched from the disabled to the enable state, the outputs of the second output means (6 to 6-n) simultaneously take on the enable state to supply the same signal.

To describe an output circuit according to the fourth aspect of the invention in detail, it has a plurality of said first output circuits (500 to 500-n in FIG. 13), into which a common enable control signal (32 in FIG. 13) is entered, whose output terminals are connected to one another in common to supply the same signal (600 in FIG. 13), and the output state of each of said output means (6 to 6-n in FIG. 13) within the plurality of said first output circuits (500 to 500-n in FIG. 13) is switched simultaneously from the disable to the enable state by said common enable control signal (32 in FIG. 13).

As described above, the output circuits according to the invention invite no increase in the delay time of signal communication by the bus circuit because the timing at which the output states of said first output means (200 in FIGS. 1, 7 and 2 and 6 to 6-n in FIG. 13) are switched from the disable to the enable state is not delayed.

Further, the output circuit according to the first aspect of the invention is characteristic in that it has the first delay circuit (33 in FIG. 1) for delaying the enable control signal (32 in FIG. 1) by the first predetermined period (td in FIG. 2), and said first output means (200 in FIG. 1) is switched from the enable to the disable state with the delayed signal supplied from the first delay circuit (33 in FIG. 1).

Therefore, when the output circuit according to the first aspect of the invention is to be used as output circuit for driving the common signal line of the bus circuit, bus fights can be securely prevented by setting said first predetermined period (td in FIG. 2) shorter than the length of time taken by another circuit from the enable timing of this output circuit (T1 in FIG. 2) to take on the enable state in the next cycle (T2 in FIG. 2).

Furthermore, an output circuit according to the second aspect of the invention is characteristic in that it has a first delay circuit (33 in FIGS. 1 and 7) for delaying the enable control signal (32 in FIGS. 1 and 7) by the first predetermined period (td in FIG. 8), and means (within 200 in FIG. 7) for switching said first output means (200 in FIGS. 1 and 7) from the enable to the disable state with a delayed signal supplied from the first delay circuit (33 in FIG. 1) and gradually performing within the second predetermined period (a differential length of time from td to td-n) control to switch the output state of said first output means (200 in FIGS. 1 and 7) from the disable to the enable state.

Therefore, when the output circuit according to the second aspect of the invention is to be used as output circuit for driving the common signal line of the bus circuit, bus fights can be securely prevented by setting the total of said first and second prescribed lengths of time (td-n in FIG. 8) shorter than the length of time taken by another circuit from the enable timing of this output circuit (T1 in FIG. 8) to take on the enable state in the next cycle (T2 in FIG. 8).

Furthermore, in particular, even if a transitional load driving current remains on the common signal line of the bus circuit in the second predetermined period (a differential length of time from td to td-n in FIG. 8) after said first predetermined period, the generation of switching noise can be reduced because the state switching of the first output means (200 in FIGS. 1 and 7) from the disable to the enable state is accomplished gradually as described above.

This makes it possible to set the total of said first and second prescribed lengths of time (td-n in FIG. 8) substantially equal to the length of time taken by the transitional driving current arising on the common signal line of the bus circuit to disappear, and thereby to minimize the operating cycle time of the bus circuit (T2–T1 in FIG. 8) to enhance the transmission efficiency.

Next, an output circuit according to the third aspect of the invention is characteristic in that it has, within said first output means (200 in FIGS. 1 and 2), a group of second delay circuits (233-2 to 233-n in FIG. 2) successively connected, into which delayed signals supplied from said first delay circuit (33 in FIGS. 1 and 2) are entered, for supplying a plurality of signals successively further delayed within the extent of the second predetermined period (a differential length of time from td to td-n in FIG. 10), and a group of second output means (6 to 6-n in FIG. 2) so controlled as to be switched from the enable to the disable state by each of the plurality of successively delayed signals, wherein the output terminals of the second output means (6 to 6-n in FIG. 2) are connected to one another in common to constitute the output of said first output means (200 in FIGS. 1 and 2) and, when the output state of said first output means (200 in FIGS. 1 and 2) is to be switched from the enable to the disable state, control to switch the output state of said first output means (200 in FIGS. 1 and 2) from the enable to the disable state is accomplished in a phased manner during the second predetermined period (a differential length of time from td to td-n in FIG. 10) by switching the outputs of the second output means (6 to 6n in FIG. 2) from the enable to the disable state with successive lags.

Therefore, when the output circuit according to the third aspect of the invention is to be used as output circuit for driving the common signal line of the bus circuit, bus fights can be securely prevented by setting the total of said first and second prescribed lengths of time (td-n in FIG. 10) shorter than the length of time taken by another circuit from the enable timing of this output circuit (T1 in FIG. 10) to take on the enable state in the next cycle (T2 in FIG. 10).

Furthermore, in particular, even if a transitional load driving current remains on the common signal line of the bus circuit in the second predetermined period (a differential length of time from td to td-n in FIG. 10) after said first predetermined period, the generation of switching noise can be reduced because the state switching of the first output means (200 in FIGS. 1 and 2) from the enable to the disable state is accomplished in a phased manner as described above.

This makes it possible to set the total of said first and second prescribed lengths of time (td-n in FIG. 10) substantially equal to the length of time taken by the transitional driving current arising on the common signal line of the bus circuit to disappear, and thereby to minimize the operating cycle time of the bus circuit (T2–T1 in FIG. 10) to enhance the transmission efficiency.

Thus, this output circuit can provide benefits substantially equivalent to that according to said second aspect of the invention.

Finally, an output circuit according to the fourth aspect of the invention is characteristic in that it has a plurality of said first output circuits (500 to 500-n in FIG. 13), into which a common enable control signal (32 in FIG. 13) is entered and whose output terminals are connected in common to supply the same signal (600 in FIG. 13), and each of said first output circuits (500 to 500-n in FIG. 13) has as its constituent element one of first delay circuits (33 to 33-n in FIG. 13) whose lengths of delay time (td to td-n in FIG. 14) are not shorter than the first predetermined period (td in FIG. 14) and slightly differ from one another within the extent of the second predetermined period (a differential length of time from td to td-n in FIG. 14), wherein control to switch the output state from the enable to the disable state after a delay by said first predetermined period (td in FIG. 14) is accomplished in a phased manner during the second predetermined period (a differential length of time from td to td-n in FIG. 14).

Therefore, when the output circuit according to the fourth aspect of the invention is to be used as output circuit for driving the common signal line of the bus circuit, bus fights can be securely prevented by setting the total of said first and second prescribed lengths of time (td-n in FIG. 14) shorter than the length of time taken by another circuit from the enable timing of this output circuit (T1 in FIG. 14) to take on the enable state in the next cycle (T2 in FIG. 14).

Furthermore, in particular, even if a transitional load driving current remains on the common signal line of the bus circuit in the second predetermined period (a differential length of time from td to td-n in FIG. 14) after said first predetermined period, the generation of switching noise can be reduced because the state switching of the plurality of said first output means (500 to 500-n in FIG. 13) from the enable to the disable state is accomplished in a phased manner as described above.

This makes it possible to set the total of said first and second prescribed lengths of time (td-n in FIG. 14) substantially equal to the length of time taken by the transitional driving current arising on the common signal line of the bus circuit to disappear, and thereby to minimize the operating cycle time of the bus circuit (T2–T1 in FIG. 14) to enhance the transmission efficiency.

Thus, this output circuit can provide benefits substantially equivalent to that according to said third aspect of the invention.

While the present invention has been described with reference to preferred embodiments thereof, it will now be readily possible for those skilled in the art to put the invention into practice in various other manners.

What is claimed is:

1. An output circuit comprising:
   a timing signal output circuit producing a timing signal;
   a delay circuit receiving said timing signal supplied from said timing signal output circuit, and generating a delay signal which is obtained by delaying said timing signal for a predetermined period of time; and
   a bus signal output means receiving said timing signal supplied from said timing signal output circuit and said delay signal supplied from said delay circuit;
   wherein said bus signal output means comprises:
      a logic circuit, receiving said timing signal and said delay signal, for outputting a signal for enabling the use of a bus when said timing signal is asserted and outputting a signal for disabling the use of said bus when said delay signal is asserted; and
      a bus buffer, receiving said signal for enabling the use of a bus supplied from said logic circuit, for outputting data while said logic circuit outputs said signal for enabling the use of a bus.

2. The output circuit as claimed in claim 1, wherein said predetermined period is shorter than a bus cycle period in said bus.

3. The output circuit as claimed in claim 2, wherein said logic circuit enables the use of said bus as soon as each bus cycle starts, and disables the use of said bus before the next bus cycle is started.

4. The output circuit as claimed in claim 3, further comprising a capacitor between said delay circuit and said bus signal output means for gradually switching the output state of said bus buffer.

5. The output circuit as claimed in claim 3, said bus buffer further comprising:

an output terminal connected to said bus;

a first transistor having a first control gate and being connected between said output terminal and a first power supply terminal of a first power supply source; and a second transistor having a second control gate and being connected between said output terminal and a second power supply terminal of a second power supply source, wherein said logic circuit supplies a first control signal to said first control gate of said first transistor in accordance with said timing signal and said delay signal, and suppplies a second control signal to said second control gate of said second transistor in accordance with said timing signal and said delay signal.

6. The output circuit as claimed in claim 5, wherein said logic circuit stops outputting said first and second control signals so that no current path is made up either between said first power supply terminal and said output terminal or between said second power supply terminal and said output terminal for a period between the end of said predetermined period of time and the start of the next bus cycle.

7. The output circuit as claimed in claim 1, said bus signal output means further comprising:

a plurality of delay circuits;

a plurality of logic circuits corresponding to said plurality of delay circuits; and wherein a N-th (N>1: integer) delay circuit receives a (N−1)-th delay signal from a (N−1)-th delay circuit and generates a N-th delay signal, each of said plurality of logic circuits receives said timing signal and a delay signal of a corresponding one of said plurality of delay circuits, and gradually switches the output state of said bus buffer from enable state to disable state as said delay signals are in turn asserted.

8. The output circuit as claimed in claim 7, wherein the sum of delay of said plurality of delay circuits is shorter than a bus cycle.

9. The output circuit as claimed in claim 8, said bus signal output means further comprising a plurality of bus buffers corresponding to said plurality of logic circuits, wherein each of said plurality of bus buffers switches the output state in accordance with a signal supplied from a corresponding one of said plurality of logic circuits.

10. The output circuit as claimed in claim 9, wherein the outputs of said plurality of bus buffers are coupled.

11. The output circuit as claimed in claim 1, further comprising:

a plurality of delay circuits each receiving said timing signal supplied from said timing signal output circuit, and each generating a delay signal which is obtained by delaying said timing signal for each predetermined period of time;

a plurality of bus signal output means corresponding to each of said a plurality of delay circuits; and an output terminal;

wherein each of said plurality of delay circuits has a different delay time from each other, and said plurality of bus signal output means each are coupled to said output terminal.

* * * * *

UNITED STATES PATENT AND TRADEMARK OFFICE
CERTIFICATE OF CORRECTION

PATENT NO. : 6,087,870
DATED : July 11, 2000
INVENTOR(S) : Welsh et al.

Page 1 of 1

It is certified that error appears in the above-identified patent and that said Letters Patent is hereby corrected as shown below:

Column 20,
Line 29, "cystic" should read -- a cystic --

Column 1,
Line 52, "Therapv" should read -- Therapy --

Column 2,
Line 22, "omithine" should read -- ornithine --
Line 39, "dysfumctional" should read -- dysfunctional --

Column 5,
Line 2, "treated" should read -- treated with --
Line 8, "treated" should read -- treated with --

Column 6,
Line 27, "serumfree" should read -- serum-free --
Line 60, "partifacilitatefacilitates" should read -- particle size facilitates --

Column 7,
Line 12, "e.," should read -- e.g., --

Signed and Sealed this

Sixteenth Day of October, 2001

Attest:

NICHOLAS P. GODICI

*Attesting Officer*  *Acting Director of the United States Patent and Trademark Office*

UNITED STATES PATENT AND TRADEMARK OFFICE
CERTIFICATE OF CORRECTION

PATENT NO. : 6,087,870
DATED : July 11, 2000
INVENTOR(S) : Welsh et al.

Page 1 of 1

It is certified that error appears in the above-identified patent and that said Letters Patent is hereby corrected as shown below:

Column 20,
Line 29, "cystic" should read -- a cystic --

Column 1,
Line 52, "Therapv" should read -- Therapy --

Column 2,
Line 22, "omithine" should read -- ornithine --
Line 39, "dysfumctional" should read -- dysfunctional --

Column 5,
Line 2, "treated" should read -- treated with --
Line 8, "treated" should read -- treated with --

Column 6,
Line 27, "serumfree" should read -- serum-free --
Line 60, "partifacilitatefacilitates" should read -- particle size facilitates --

Column 7,
Line 12, "e.," should read -- e.g., --

Signed and Sealed this

Twenty-second Day of January, 2002

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,087,870
DATED : July 11, 2000
INVENTOR(S) : Welsh et al.

It is certified that error appears in the above-identified patent and that said Letters Patent is hereby corrected as shown below:

Column 20,
Line 29, "cystic" should read -- a cystic --

Column 1,
Line 52, "Therapv" should read -- Therapy --

Column 2,
Line 22, "omithine" should read -- ornithine --
Line 39, "dysfumctional" should read -- dysfunctional --

Column 5,
Line 2, "treated" should read -- treated with --
Line 8, "treated" should read -- treated with --

Column 6,
Line 27, "serumfree" should read -- serum-free --
Line 60, "partifacilitatefacilitates" should read -- particle size facilitates --

Column 7,
Line 12, "e.," should read -- e.g., --

Signed and Sealed this

Twenty-ninth Day of January, 2002

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,087,870
DATED : July 11, 2000
INVENTOR(S) : Fumihiko Sakamoto

It is certified that error appears in the above-identified patent and that said Letters Patent is hereby corrected as shown below:

This certificate supersedes Certificates of Correction issued October 16, 2001, January 22, 2002, and January 29, 2002 the number was erroneously mentioned and all certificates should be vacated since no Certificate of Correction was granted.

Signed and Sealed this

Fourteenth Day of October, 2003

JAMES E. ROGAN
*Director of the United States Patent and Trademark Office*